(12) United States Patent
Ohta et al.

(10) Patent No.: US 7,714,296 B2
(45) Date of Patent: May 11, 2010

(54) IMAGE DETECTING DEVICE AND IMAGE CAPTURING SYSTEM

(75) Inventors: Yasunori Ohta, Yokohama (JP); Kazuo Hakamata, Odawara (JP); Kuniaki Miyako, Minami-ashigara (JP); Hajime Nakata, Minami-ashigara (JP); Yuto Tanaka, Kawasaki (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/239,417

(22) Filed: Sep. 26, 2008

(65) Prior Publication Data

US 2009/0084970 A1 Apr. 2, 2009

(30) Foreign Application Priority Data

Sep. 27, 2007 (JP) ............... 2007-252605

(51) Int. Cl.
*G01T 1/24* (2006.01)
(52) U.S. Cl. .................. 250/370.15
(58) Field of Classification Search .......... 250/370.01–370.15; 378/98.8
See application file for complete search history.

(56) References Cited

U.S. PATENT DOCUMENTS

| | | | | |
|---|---|---|---|---|
| 5,319,696 A * | 6/1994 | Abdel-Malek et al. | ...... | 378/108 |
| 6,713,769 B2 * | 3/2004 | Vafi et al. | ............... | 250/370.15 |
| 2005/0017188 A1 * | 1/2005 | Yagi | ...................... | 250/370.09 |
| 2005/0067579 A1 * | 3/2005 | Tsuchiya et al. | ........ | 250/370.15 |
| 2006/0026610 A1 * | 2/2006 | Sasao et al. | .................. | 720/649 |
| 2007/0272873 A1 * | 11/2007 | Jadrich et al. | ........... | 250/370.11 |
| 2007/0276248 A1 * | 11/2007 | Saito et al. | ................... | 600/459 |

FOREIGN PATENT DOCUMENTS

JP 10-256613 A 9/1998

OTHER PUBLICATIONS

Redus et al., "Improved sensitivity X-ray detectors for field applications", 2002, IEEE Transactions on Nuclear Science, vol. 49, Issue 6, Part 2, pp. 3247-3253.*

* cited by examiner

*Primary Examiner*—David P Porta
*Assistant Examiner*—Kiho Kim
(74) *Attorney, Agent, or Firm*—Sughrue Mion, PLLC

(57) ABSTRACT

A radiation solid-state detecting device includes a cooling panel disposed on a surface of a sensor substrate that is irradiated with radiation, or on a rear surface of the sensor substrate opposite to the irradiated surface thereof. The cooling panel comprises a plurality of cooling units. Cooling units, which face (pixels depending on) the recording areas in which radiation image information is recorded in the sensor substrate, are energized to cool the recording areas.

13 Claims, 16 Drawing Sheets

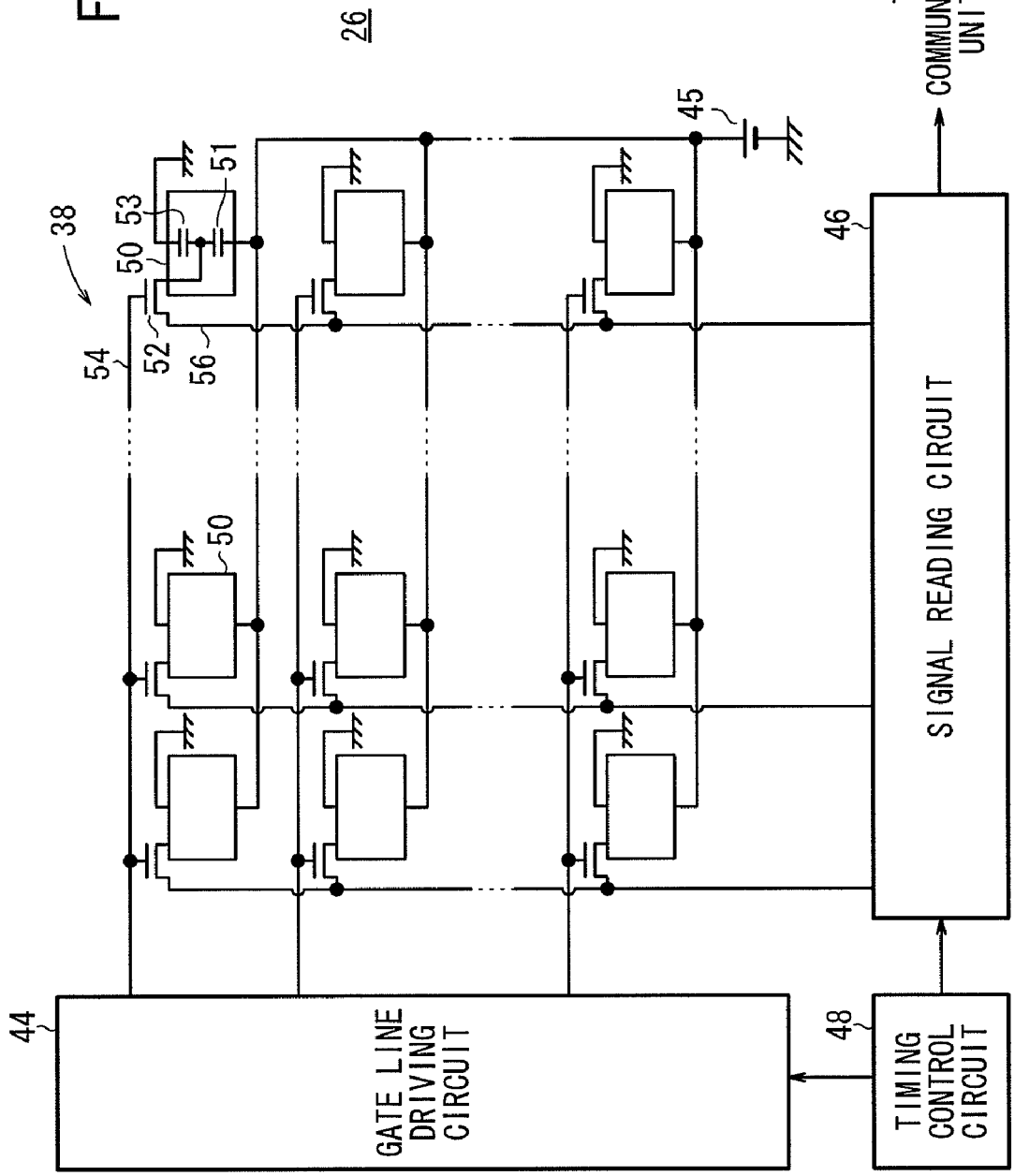

IMAGE DETECTING DEVICE AND IMAGE CAPTURING SYSTEM

BACKGROUND OF THE INVENTION

1. Field of the Invention

The present invention relates to an image detecting device for outputting image information representative of an image recorded in a given recording area, as well as to an image capturing system, which incorporates such an image detecting device.

2. Description of the Related Art

In the medical field, there have widely been used image capturing apparatuses, which apply radiation from a radiation source to a subject (patient) and detect the radiation that has passed through the subject with an image detector, to thereby acquire radiation image information of the subject.

Japanese Laid-Open Patent Publication No. 10-256613 discloses a Peltier cooling device comprising a photodetector such as a CCD or the like, a Peltier device held closely against the entire rear surface of the photodetector, and heat radiating fins disposed on the rear surface of the Peltier device. The Peltier device cools the photodetector for improving the S/N ratio of the signal output from the photodetector.

When a surface of an image detector, such as a photodetector, is irradiated with radiation, the image detector outputs image information representing an image that is recorded in a given area (recording area) of the image detector. According to Japanese Laid-Open Patent Publication No. 10-256613, since the entire rear surface of the photodetector is cooled by the Peltier device, areas of the photodetector where the image is not recorded also are cooled by the Peltier device. Therefore, the Peltier device wastefully consumes energy for cooling the photodetector, because it cools unnecessary areas of the photodetector.

SUMMARY OF THE INVENTION

It is an object of the present invention to provide an image detecting device and an image capturing system, which are capable of saving energy by avoiding unnecessary cooling of the image detecting device.

According to the present invention, an image detecting device comprises an image detector for recording an image and outputting the recorded image as image information, and a cooling panel disposed on a surface of the image detector for cooling a recording area in which the image is recorded in the image detector.

Since the cooling panel disposed on the surface of the image detector cools only the recording area in which the image is recorded in the image detector, the image capturing system can avoid unnecessary cooling of the sensor substrate, compared with image capturing systems of the related art, and energy consumed by the radiation solid-state detecting device including the cooling panel and the overall image capturing system can be reduced.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is a block diagram of the radiation solid-state detecting device shown in FIG. 1;

DESCRIPTION OF THE PREFERRED EMBODIMENTS

Figure 1:
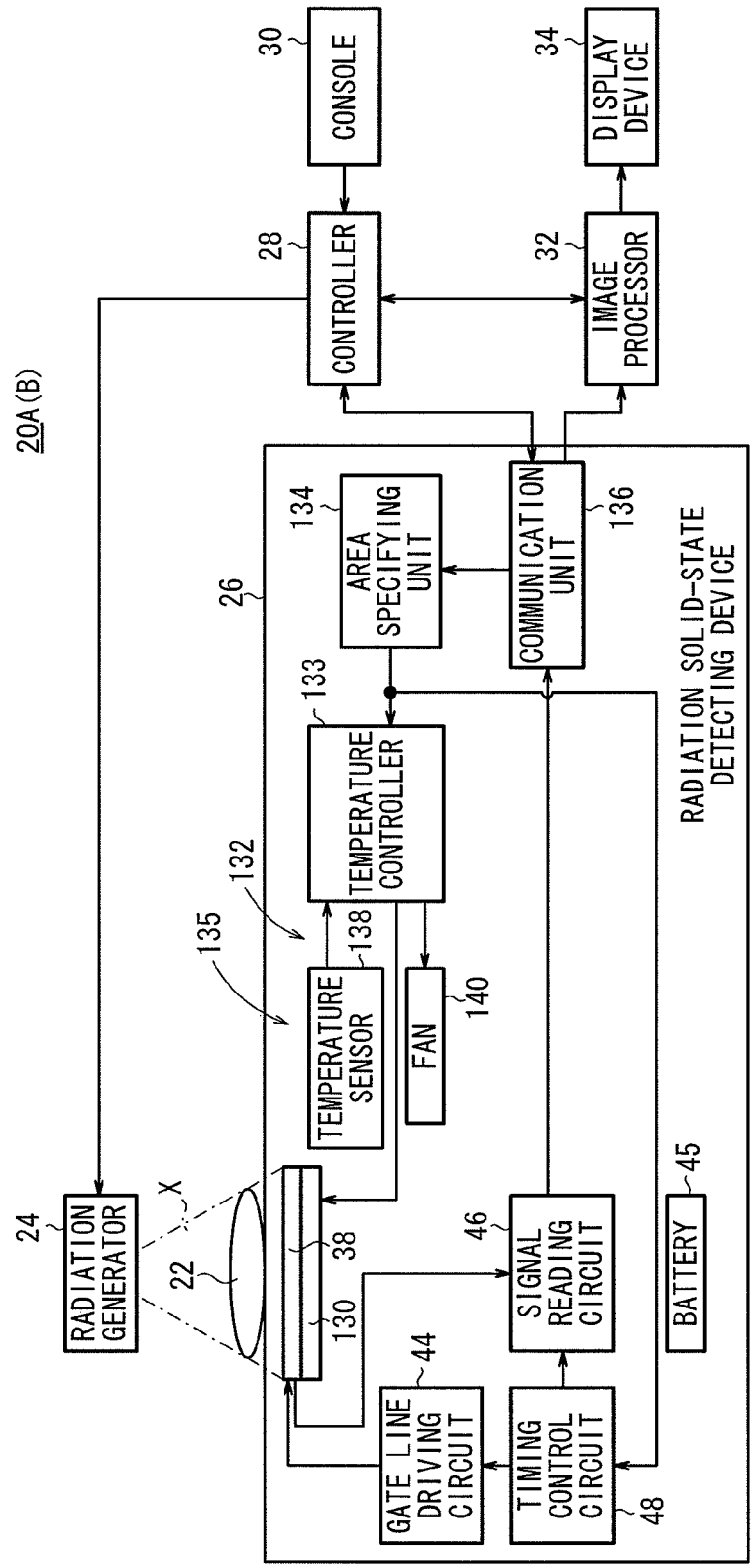
FIG. 1 is a block diagram of an image capturing system according to first and second embodiments of the present invention.

Like or corresponding parts of the invention are denoted using like or corresponding reference characters throughout the views.

As shown in FIG. 1, an image capturing system 20A according to a first embodiment of the present invention comprises a radiation generator 24 for generating and applying radiation X to a subject 22, typically a patient, a radiation solid-state detecting device (an image detecting device, a radiation image information detecting device) 26 for detecting radiation X that has passed through the subject 22, a controller 28 for controlling the radiation generator 24 and the radiation solid-state detecting device 26, a console 30 for setting image capturing conditions in the controller 28, such as a radiation dose for the radiation X to be applied to the subject 22, an image processor 32 for processing radiation image information of the subject 22, which is read from the radiation solid-state detecting device 26, and a display device 34 for displaying the processed radiation image information.

The radiation solid-state detecting device 26 comprises a sensor substrate (image detector) 38, a gate line driving circuit 44, a battery 45, a signal reading circuit 46, a timing control circuit 48, a temperature regulation control means 135, an area specifying unit 134, and a communication means 136. The temperature regulation control means 135 comprises a cooling panel 130 and a cooling panel energizing unit 132. The cooling panel energizing unit 132 comprises a temperature controller 133, a temperature sensor 138, and a fan (a cooling fan) 140.

Figure 2A:
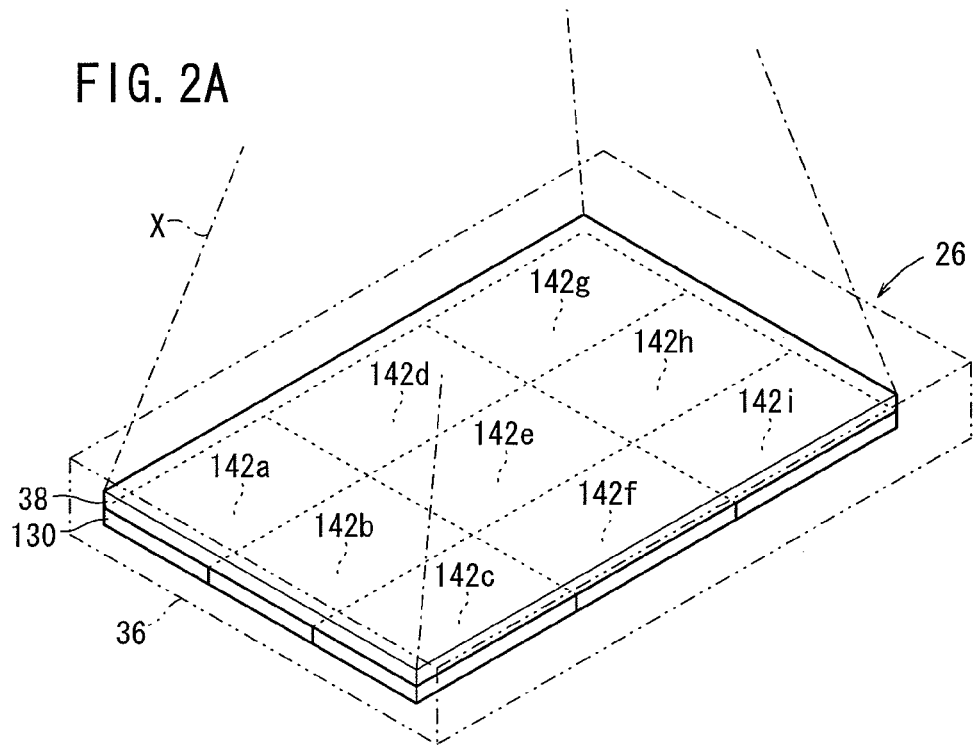
FIG. 2A is a perspective view of a radiation solid-state detecting device shown in FIG. 1, with a cooling panel disposed on a rear surface of a sensor substrate.
Figure 2B:
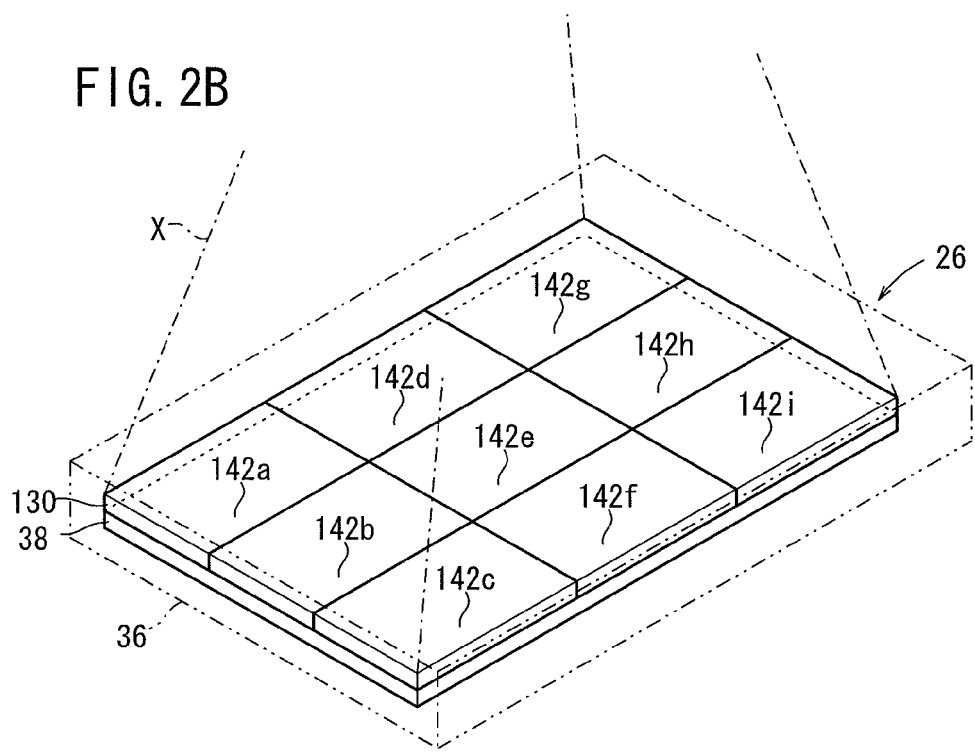
FIG. 2B is a perspective view of the radiation solid-state detecting device shown in FIG. 1, with the cooling panel disposed on an irradiated surface of the sensor substrate.

FIGS. 2A and 2B show the radiation solid-state detecting device 26 in perspective. As shown in FIGS. 2A and 2B, the radiation solid-state detecting device 26 comprises a sensor substrate 38 housed in a protective casing 36 for storing (recording) as two-dimensional electric charge information radiation image information carried by the radiation X that has passed through the subject 22 (see FIG. 1), and a cooling panel 130 held closely against a front surface (irradiated surface) that is irradiated with radiation X, or against a rear surface of the sensor substrate 38, which is opposite to the front surface.

FIG. 2A shows the radiation solid-state detecting device 26 with the cooling panel 130 being disposed substantially fully over the rear surface of the sensor substrate 38. The cooling panel 130 comprises nine rectangular cooling units 142a through 142i, which are placed on the rear surface of the sensor substrate 38. FIG. 2B shows the radiation solid-state detecting device 26 with the cooling panel 130 being disposed substantially fully over the irradiated surface of the sensor substrate 38. The cooling panel 130 comprises nine rectangular cooling units 142a through 142i, which are placed on the irradiated surface of the sensor substrate 38.

FIG. 3 shows the radiation solid-state detecting device 26 in block form. As shown in FIG. 3, the radiation solid-state detecting device 26 comprises the sensor substrate 38, a gate line driving circuit 44 having a plurality of driving ICs, not shown, a signal reading circuit 46 having a plurality of reading ICs 42 (see FIG. 4), and a timing control circuit 48 for controlling the gate line driving circuit 44 and the signal reading circuit 46.

The sensor substrate 38 comprises an array of thin-film transistors (TFTs) 52 arranged in rows and columns, a photoelectric conversion layer 51 made of a material such as amorphous selenium (a-Se), which generates electric charges upon detection of radiation X (see FIGS. 1 through 1B), the photoelectric conversion layer 51 being disposed on the array of TFTs 52, and an array of storage capacitors 53 connected to the photoelectric conversion layer 51. When radiation X is applied to the sensor substrate 38, the photoelectric conversion layer 51 generates electric charges, and the storage capacitors 53 store the generated electric charges. Then, the TFTs 52 are turned on, one row at a time, to read electric charges from the storage capacitors 53 as an image signal. In FIG. 3, the photoelectric conversion layer 51 and one of the storage capacitors 53 are shown as making up a pixel 50. The pixel 50 is connected to one of the TFTs 52. Details of the other pixels 50 have been omitted from illustration. Since amorphous selenium tends to change its structure and lose functions thereof at high temperatures, amorphous selenium needs to be used within a certain temperature range. The TFTs 52 connected to the respective pixels 50 are connected to respective gate lines 54 extending parallel to the rows, and to respective signal lines 56 extending parallel to the columns. The gate lines 54 are connected to the gate line driving circuit 44, and the signal lines 56 are connected to the signal reading circuit 46.

Figure 4:
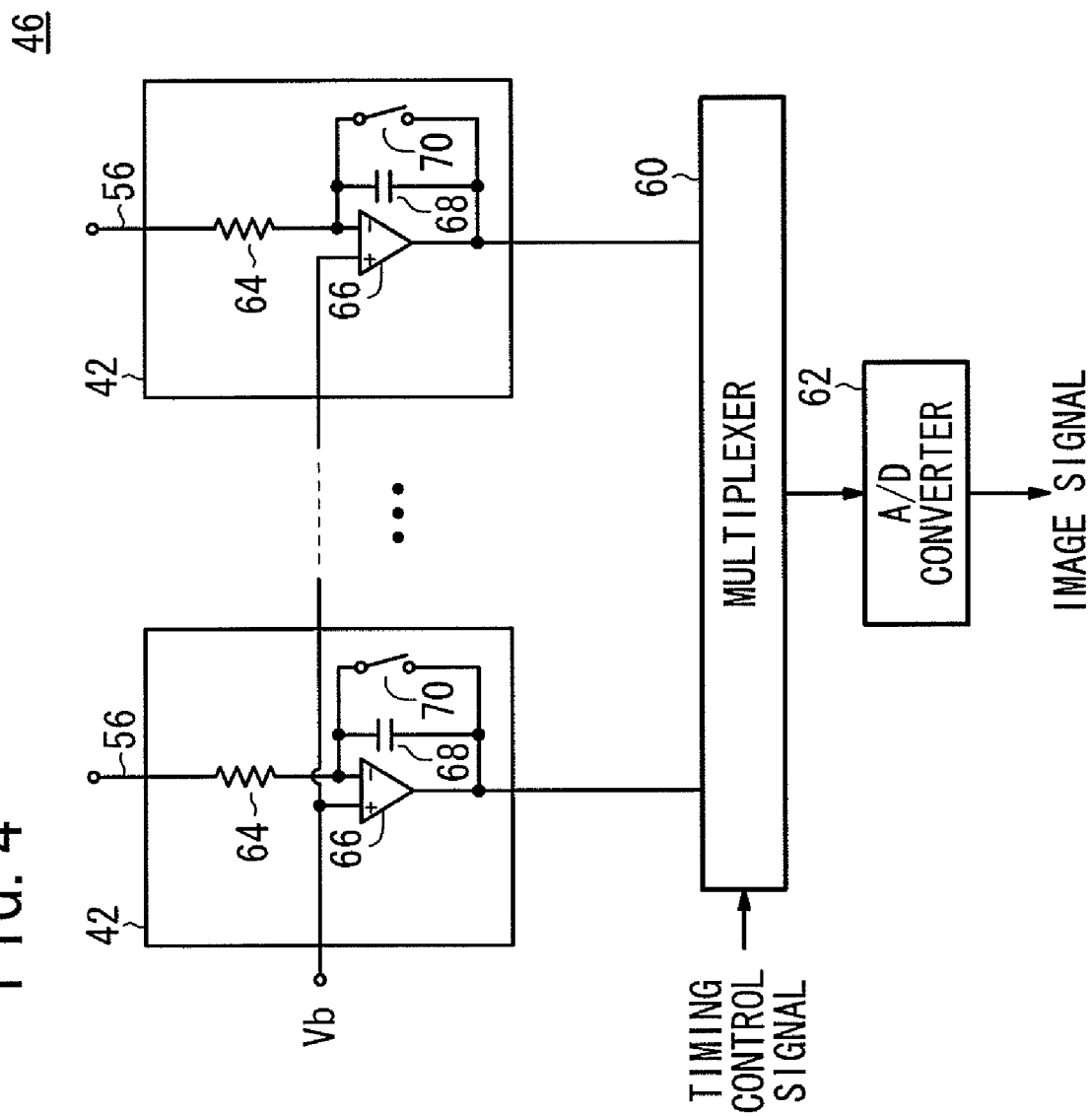
FIG. 4 is a detailed block diagram of a signal reading circuit shown in FIG. 3.

FIG. 4 shows the signal reading circuit 46 in detailed block form. As shown in FIG. 4, the signal reading circuit 46 comprises a plurality of reading ICs 42 connected to respective signal lines 56 of the sensor substrate 38 (see FIGS. 1 through 3), a multiplexer 60 for selecting the pixels 50 connected to one of the signal lines 56 based on a timing signal from the timing control circuit 48, and an A/D converter 62 for converting radiation image information read from the selected pixels into a digital image signal, and sending (outputting) the digital image signal via the communication means 136 to the image processor 32.

Each of the reading ICs 42 comprises an operational amplifier (integrating amplifier) 66 that detects current supplied from the signal line 56 through a resistor 64, an integrating capacitor 68, and a switch 70. The operational amplifier 66 has an inverting input terminal connected to the signal line 56 through the resistor 64, and a non-inverting input terminal supplied with a reference voltage Vb.

Figure 5A:
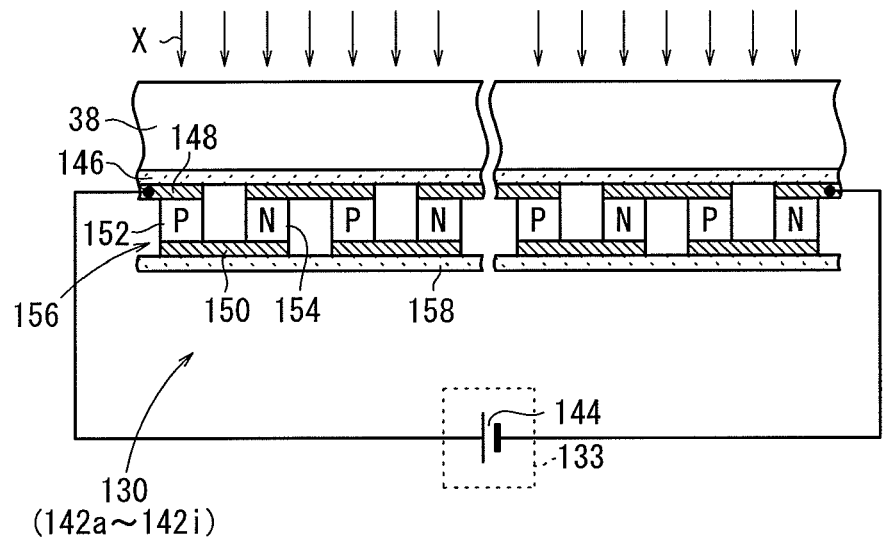
FIG. 5A is a fragmentary cross-sectional view of the sensor substrate and the cooling panel shown in FIG. 2A.
Figure 5B:
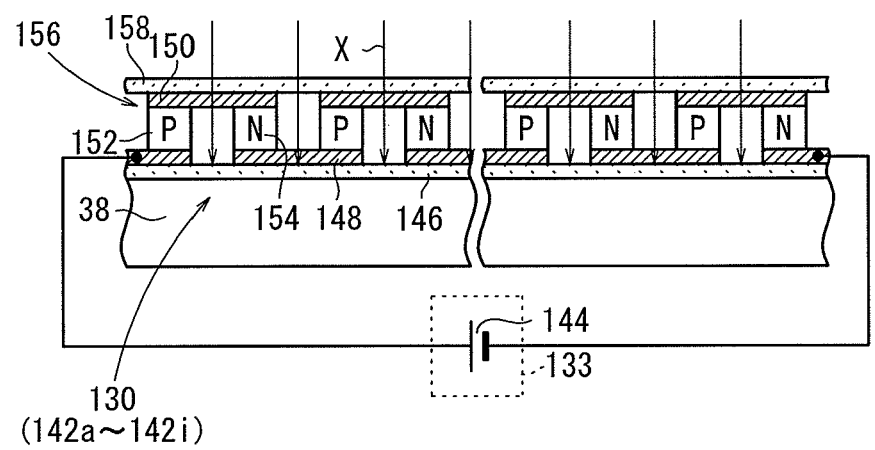
FIG. 5B is a fragmentary cross-sectional view of the sensor substrate and the cooling panel shown in FIG. 2B.

FIGS. 5A and 5B show in fragmentary cross section the sensor substrate 38 and the cooling panel 130 (see FIGS. 1 through 2B). FIG. 5A shows the sensor substrate 38 and the cooling panel 130 shown in FIG. 2A, and FIG. 5B shows the sensor substrate 38 and the cooling panel 130 shown in FIG. 2B.

Each of the cooling units 142a through 142i of the cooling panel 130 comprises a plurality of Peltier devices 156.

Specifically, each of the cooling units 142a through 142i comprises an endothermic substrate 146 held closely against the irradiated surface or the rear surface of the sensor substrate 38, a plurality of endothermic electrodes 148 disposed at given spaced intervals on the endothermic substrate 146, P-type semiconductor devices 152 and N-type semiconductor devices 154 joined respectively to opposite ends of the endothermic electrodes 148, a plurality of exothermic electrodes 150 each interconnecting a P-type semiconductor device 152 connected to one of the endothermic electrodes 148 and an N-type semiconductor device 154 connected to an adjacent one of the endothermic electrodes 148, and an exothermic substrate 158 held closely against the exothermic electrodes 150.

In FIG. 5A, the endothermic substrate 146, the endothermic electrodes 148, the P-type semiconductor devices 152 and the N-type semiconductor devices 154, the exothermic electrodes 150, and the exothermic substrate 158 are stacked successively in this order, downwardly from the rear surface of the sensor substrate 38, thereby making up the cooling units 142a through 142i. In FIG. 5B, the endothermic substrate 146, the endothermic electrodes 148, the P-type semiconductor devices 152 and the N-type semiconductor devices 154, the exothermic electrodes 150, and the exothermic substrate 158 are stacked successively in this order, upwardly from the irradiated surface of the sensor substrate 38, thereby making up the cooling units 142a through 142i.

Each of the Peltier devices 156 is made up of two adjacent endothermic electrodes 148, an exothermic electrode 150 extending between the two endothermic electrodes 148, and a P-type semiconductor device 152 and an N-type semiconductor device 154, which are interconnected by the exothermic electrode 150. The temperature controller 133 comprises a DC power supply 144 connected to the endothermic electrode 148 joined to the leftmost P-type semiconductor device 152 in FIGS. 5A and 5B, and the endothermic electrode 148 joined to the rightmost N-type semiconductor device 154 in FIGS. 5A and 5B.

The endothermic substrate 146 and the exothermic substrate 158 preferably are made of a thermally conductive material made from, e.g., ceramics, the thermal conductivity of which is oriented from the sensor substrate 38 toward the cooling units 142a through 142i.

In FIGS. 2B and 5B, the cooling panel 130 is disposed on the irradiated surface of the sensor substrate 38. When the cooling panel 130 is disposed on the irradiated surface of the sensor substrate 38, the endothermic electrodes 148 and the exothermic substrate 158 of the cooling units 142a through 142i are made of a material that is permeable to radiation X.

As described above, the photoelectric conversion layer 51 (see FIG. 3) of the sensor substrate 38 is made of amorphous selenium. Since amorphous selenium tends to change its structure and lose functions at high temperatures, amorphous selenium needs to be used within a certain temperature range. The radiation solid-state detecting device 26 includes the temperature regulation control means 135 (see FIG. 1) for cooling the sensor substrate 38 when the temperature of the photoelectric conversion layer 51 (amorphous selenium) exceeds its temperature range, thereby keeping the temperature of the photoelectric conversion layer 51 within the temperature range.

The temperature sensor 138 of the temperature regulation control means 135, which is disposed near the sensor substrate 38, detects the temperature of the sensor substrate 38 depending on the temperature of the amorphous selenium, at all times or at certain time intervals, and outputs the detected temperature of the sensor substrate 38 to the temperature controller 133. The temperature controller 133 determines whether the input temperature of the sensor substrate 38 exceeds a given upper-limit temperature, depending on the upper-limit value of the temperature range for the photoelectric conversion layer 51 (amorphous selenium). If the temperature controller 133 judges that the temperature of the sensor substrate 38 has exceeded the upper-limit temperature, then the temperature controller 133 supplies direct current from the DC power supply 144 to the Peltier devices 156, and also energizes the fan 140. When the Peltier devices 156 are supplied with direct current, the Peltier devices 156 exhibit a phenomenon referred to as the Peltier effect, i.e., the junctions between the endothermic electrodes 148 and the P-type semiconductor devices 152 and the N-type semiconductor devices 154 absorb the heat of the amorphous selenium from the sensor substrate 38 through the endothermic substrate 146. Further, the junctions between the P-type semiconductor devices 152 and the N-type semiconductor devices 154 and the exothermic electrodes 150 radiate heat that has been transferred from the junctions of the endothermic electrodes 148 through the P-type semiconductor devices 152 and the N-type semiconductor devices 154, the heat being radiated through the exothermic substrate 158 and out of the cooling panel 130. The fan 140 applies air to the exothermic substrate 158 in order to cool the exothermic substrate 158 and to promote the radiation of heat therefrom.

The upper-limit temperature referred to above may be pre-registered in the temperature controller 133, or may be pre-registered as one of the image capturing conditions in the controller 28 and transmitted from the controller 28 via the communication means 136 to the temperature controller 133, before a radiation image is captured.

Figure 6:
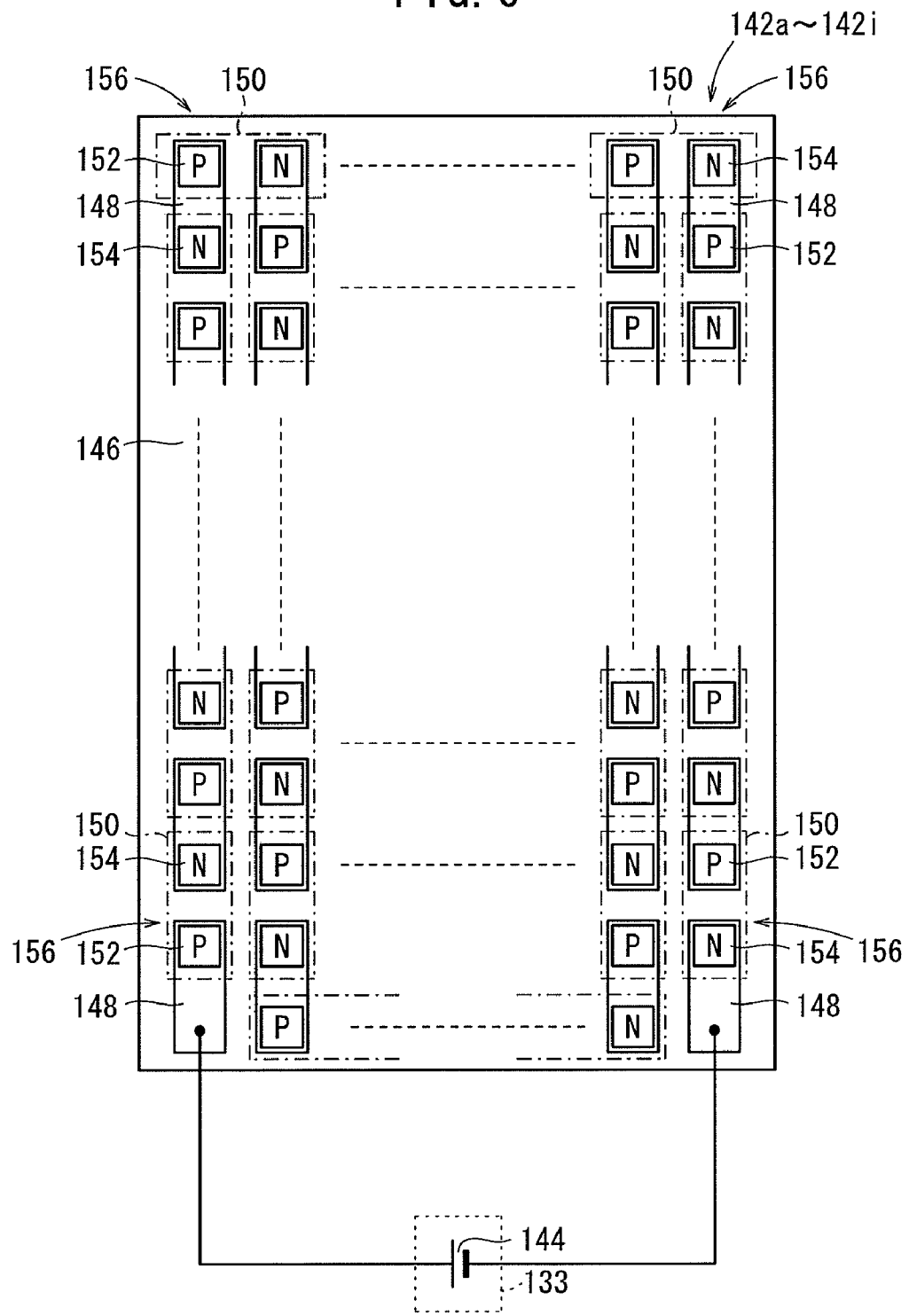
FIG. 6 is a plan view showing the layout of Peltier devices disposed in each of the cooling units shown in FIGS. 2A and 2B.

FIG. 6 shows in plan the layout of the Peltier devices 156 disposed in each of the cooling units 142a through 142i. The sensor substrate 38 and the exothermic substrate 158 (see FIGS. 1 through 3, 5A and 5B) are omitted from illustration. In FIG. 6, the Peltier devices 156 are shown as viewed in a direction from the exothermic substrate 158 toward the sensor substrate 38, regardless of whether the cooling panel 130 is disposed on the rear surface of the sensor substrate 38, as shown in FIGS. 2A and 5A, or on the irradiated surface of the sensor substrate 38, as shown in FIGS. 2B and 5B.

As shown in FIG. 6, in each of the cooling units 142a through 142i, the Peltier devices 156 are arrayed in a matrix on the endothermic substrate 146. When the Peltier devices 156 are supplied with direct current from the DC power supply 144, each of the Peltier devices 156 absorbs heat from the amorphous selenium of the sensor substrate 38, and radiates the heat through the exothermic substrate 158 (see FIGS. 5A and 5B) and out of the cooling panel 130. The temperature controller 133 (see FIG. 1) of the cooling panel energizing unit 132 can selectively supply direct current from the DC power supply 144 to the cooling units 142a through 142i, and radiate heat from the amorphous selenium within given areas of the sensor substrate 38 that face the cooling units 142a through 142i, the heat being radiated through the cooling units 142a through 142i and out of the cooling panel 130.

The area specifying unit 134 (see FIG. 1) specifies pixels 50 in which to record radiation image information, based on the image capturing conditions transmitted from the controller 28 via the communication means 136, and outputs each of the specified pixels 50 as a recording area for the radiation image information to the timing control circuit 48 and to the temperature controller 133. Therefore, the controller 28 preferably should send the image capturing conditions to the area specifying unit 134, in order to cause the area specifying unit 134 to specify the recording areas, prior to the subject 22 being irradiated with radiation X, or more specifically, before the radiation X reaches the irradiated surface of the sensor substrate 38 to thereby store electric charges in the storage capacitors 53 (see FIG. 3).

Based on the supplied recording areas, the timing control circuit 48 outputs a timing control signal to the gate line driving circuit 44 and to the signal reading circuit 46 in order to read image signals from the specified pixels 50. Based on the supplied recording areas, the temperature controller 133 supplies direct current from the DC power supply 144 to the Peltier devices 156 (see FIGS. 5A through 6) of the cooling units 142a through 142i, which face the specified pixels 50.

Figure 7A:
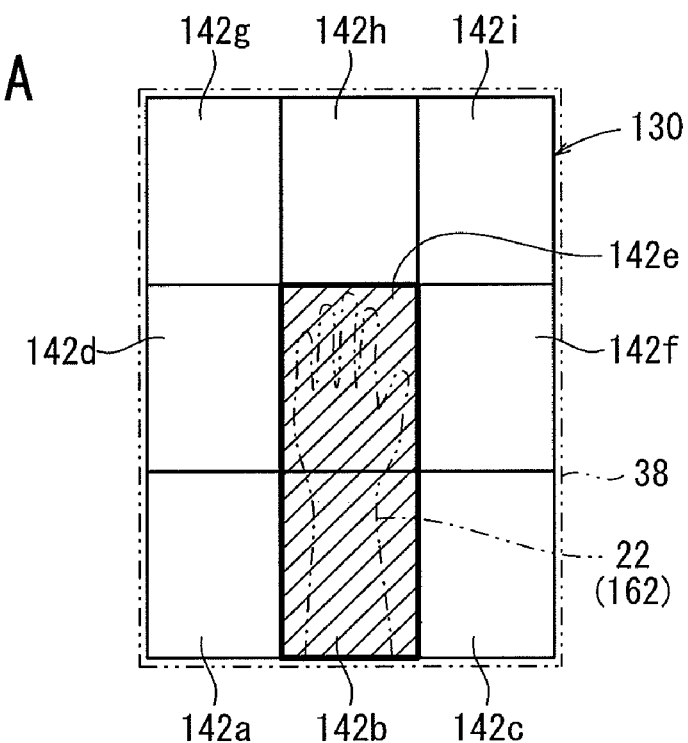
FIG. 7A is a plan view showing the manner in which a cooling unit is selected for capturing an image of an arm of a subject.
Figure 7B:
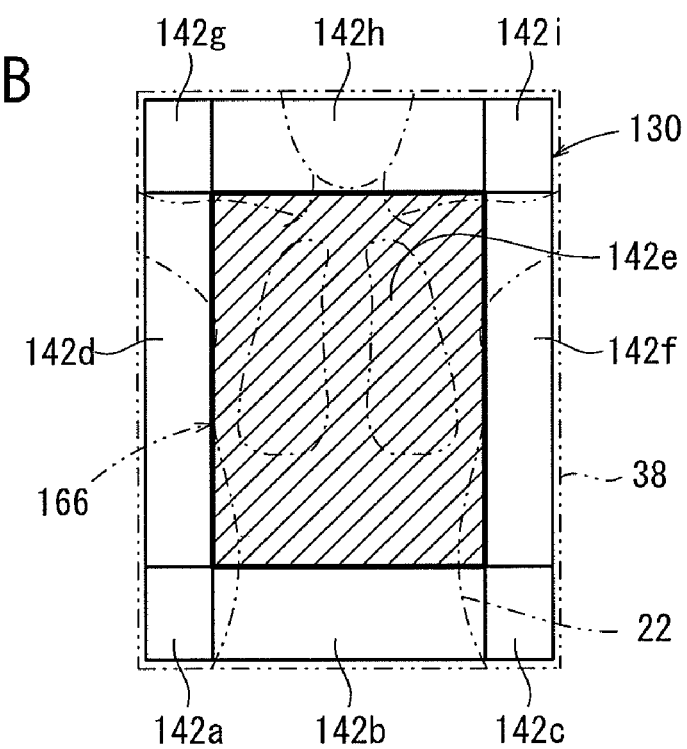
FIG. 7B is a plan view showing the manner in which cooling units are selected for capturing an image of the chest of the subject.

FIGS. 7A and 7B show in plan the manner in which some of the cooling units 142a through 142i, which are supplied with direct current from the DC power supply 144, are selected based on the recording areas input from the area specifying unit 134. In FIGS. 7A and 7B, the sensor substrate 38 is illustrated by the two-dot-and-dash lines, and those of the cooling units 142a through 142i that are selected by the temperature controller 133 are shown in cross-hatching, enclosed by the thick solid lines.

FIG. 7A shows the manner in which the cooling units are selected for capturing an image of an arm 162 of the subject 22. The image capturing conditions transmitted from the controller 28 (see FIG. 1) to the area specifying unit 134 include an image capturing condition, which indicates that the region to be imaged of the subject 22 is the arm 162. Based on the image capturing conditions, the area specifying unit 134 specifies pixels 50 (see FIG. 3) for recording radiation image information of the arm 162 therein, and outputs the specified pixels 50 as recording areas to the temperature controller 133 and to the timing control circuit 48. Based on the input recording areas, the temperature controller 133 selects cooling units 142*b*, 142*e* which, as viewed in plan, face toward the specified pixels 50 that record radiation image information of the arm 162, and supplies the Peltier devices 156 of the selected cooling units 142*b*, 142*e* with direct current from the DC power supply 144.

FIG. 7B shows the manner in which the cooling units are selected for capturing an image of the chest 166 of the subject 22. The image capturing conditions transmitted from the controller 28 (see FIG. 1) to the area specifying unit 134 include an image capturing condition, which indicates that the region to be imaged of the subject 22 is the chest 166. Based on the image capturing conditions, the area specifying unit 134 specifies pixels 50 (see FIG. 3) for recording radiation image information of the chest 166 therein, and outputs the specified pixels 50 as recording areas to the temperature controller 133 and to the timing control circuit 48. Based on the input recording areas, the temperature controller 133 selects a cooling unit 142*e* which, as viewed in plan, faces toward the specified pixels 50 that record therein radiation image information of the chest 166, and supplies the Peltier devices 156 of the selected cooling unit 142*e* with direct current from the DC power supply 144. In FIG. 7B, based on how the radiation image information of the chest 166 is captured, the cooling unit 142*e*, which is disposed centrally in the cooling panel 130, has a greater area than the other cooling units 142*a* through 142*d*, and 142*f* through 142*i*.

The image capturing system 20 is basically constructed as described above. Operations of the image capturing system 20 shall be described below with reference to FIGS. 1 through 7B.

Using the console 30, the operator, typically a radiological technician, sets ID information concerning the subject 22, image capturing conditions, etc. The ID information includes information as to the name, age, sex, etc., of the subject 22, and can be acquired from an ID card possessed by the subject 22. The image capturing conditions include, in addition to information about the region of the subject 22 to be imaged, an image capturing direction, etc., as specified by the doctor in charge of the subject 22, an irradiation dose of the radiation X depending on the region to be imaged, and the upper-limit temperature for the sensor substrate 38, which corresponds to the upper-limit value of the temperature range for amorphous selenium. If the image capturing system 20 is connected to a network, then such items of information also can be acquired from a higher-level apparatus through the network. Alternatively, such items of information can be entered from the console 30 by the operator.

After the region of the subject 22 to be imaged has been positioned with respect to the radiation solid-state detecting device 26, the controller 28 controls the radiation generator 24 and the radiation solid-state detecting device 26, according to the set image capturing conditions. Based on the image capturing conditions sent from the controller 28 via the communication means 136, the area specifying unit 134 of the radiation solid-state detecting device 26 specifies pixels 50 in which radiation image information is recorded, and outputs the specified pixels 50 as a recording area for the radiation image information to the timing control circuit 48 and to the temperature controller 133.

The temperature sensor 138 detects the temperature of the sensor substrate 38 depending on the temperature of the amorphous selenium, at all times or at certain time intervals, and outputs the detected temperature of the sensor substrate 38 to the temperature controller 133. Based on the input recording areas, the temperature controller 133 selects corresponding ones from among the cooling units 142*a* through 142*i* to which direct current from the DC power supply 144 is supplied, and determines whether the temperature of the sensor substrate 38 exceeds a given upper-limit temperature, depending on the upper-limit value of the temperature range for the photoelectric conversion layer 51 (amorphous selenium), each time that the temperature controller 133 is supplied with the temperature of the sensor substrate 38 from the temperature sensor 138, which may take place at all times or at certain time intervals.

The radiation generator 24 applies radiation X to the subject 22 according to the image capturing conditions sent from the controller 28. Radiation X that has passed through the subject 22 is converted into electric signals by the photoelectric conversion layer 51, defined by the pixels 50 of the specified recording areas in the sensor substrate 38 of the radiation solid-state detecting device 26. The electric signals are stored as electric charges in the storage capacitors 53 (see FIG. 3). The stored electric charges, which represent radiation image information of the subject 22, are read from the storage capacitors 53 according to timing control signals supplied from the timing control circuit 48 to the gate line driving circuit 44 and to the signal reading circuit 46.

As described above, since the area specifying unit 134 outputs recording areas to the timing control circuit 48, the timing control circuit 48 outputs timing control signals to the gate line driving circuit 44 and to the signal reading circuit 46 based on the recording areas, in order to read image signals from the pixels 50 of the storage capacitors 53 where electric charges are stored based on the recording areas.

Specifically, the gate line driving circuit 44 selects one of the gate lines 54 according to the timing control signal from the timing control circuit 48, and supplies drive signals to bases of the TFTs 52 connected to the selected gate line 54. The multiplexer 60 of the signal reading circuit 46 successively switches between the signal lines 56 connected to the reading ICs 42 in order to select one of the signal lines 56 at a time. An electric charge representing the radiation image information that is stored in the storage capacitor 53 of the pixel 50, which corresponds to the selected gate line 54 and the selected signal line 56, is supplied through the resistor 64 to the operational amplifier 66. The operational amplifier 66 integrates the supplied electric charge and supplies it through the multiplexer 60 to the A/D converter 62, which converts the electric charge into a digital image signal. The digital image signal is supplied through the communication means 136 to the image processor 32. After all of the image signals have been read from the pixels 50 connected to the selected gate line 54, the gate line driving circuit 44 selects the next gate line 54 and supplies a drive signal to the selected gate line 54. The signal reading circuit 46 then successively reads image signals from the TFTs 52 connected to the selected gate line 54, in the same manner as described above. The above operation is repeated to read two-dimensional radiation image information stored in the pixels 50 that define specified recording areas in the sensor substrate 38, and to supply the read two-dimensional radiation image information to the image processor 32.

The radiation image information supplied to the image processor 32 is processed thereby. The display device 34 displays an image based on the processed radiation image information from the image processor 32, which is utilized for diagnostic purposes. Thus, the doctor can make a diagnosis based on the image displayed on the display device 34.

If the cooling panel 130 is disposed on the irradiated surface of the sensor substrate 38 (see FIGS. 2B and 5B), then the cooling panel 130 should be made of a material that is permeable to radiation X. Since the endothermic electrodes 148, the P-type semiconductor devices 152, the N-type semiconductor devices 154, and the exothermic electrodes 150 of the cooling units 142a through 142i contain metals therein, a portion of the radiation X applied to the sensor substrate 38 may possibly be absorbed by the metals. To avoid this drawback, the layout pattern of the Peltier devices 156 in the cooling units 142a through 142i may be pre-registered. Then, when radiation image information is input thereto, a reduction in quality of the radiation image information can be compensated for by means of an image processing method based on the registered layout pattern. In this manner, the radiation image information is prevented from becoming adversely affected by undue absorption of radiation X by the metals.

The temperature controller 133 (see FIG. 1) sequentially determines whether (the temperature of the sensor substrate 38 depending on) the temperature of the amorphous selenium within the recording areas has exceeded (the upper-limit temperature of the sensor substrate 38 depending on the upper-limit value of) the temperature range for amorphous selenium. If the temperature controller 133 judges that the temperature of the sensor substrate 38 has exceeded the upper-limit temperature, then the temperature controller 133 selects those among the cooling units 142a through 142i that face the recording areas, and supplies direct current from the DC power supply 144 to the Peltier devices 156 of the selected cooling units 142a through 142i, while also energizing the fan 140.

The Peltier devices 156, when supplied with direct current, exhibit a phenomenon referred to as the Peltier effect. More specifically, junctions between the endothermic electrodes 148 and the P-type semiconductor devices 152 and the N-type semiconductor devices 154 absorb heat of the amorphous selenium from the sensor substrate 38 through the endothermic substrate 146, whereas junctions between the P-type semiconductor devices 152 and the N-type semiconductor devices 154 and the exothermic electrodes 150 radiate heat that has been transferred from the junctions of the endothermic electrodes 148, through the P-type semiconductor devices 152 and the N-type semiconductor devices 154, through the exothermic substrate 158, and out of the cooling panel 130. The fan 140 applies air to the exothermic substrate 158 to cool the exothermic substrate 158 and for promoting radiation of heat therefrom.

If the temperature controller 133 judges that the temperature of the sensor substrate 38 detected by the temperature sensor 138 has become lower than the upper-limit temperature, then the temperature controller 133 stops supplying direct current from the DC power supply 144 to the Peltier devices 156 and de-energizes the fan 140.

With the image capturing system 20A according to the first embodiment, the radiation solid-state detecting device 26 includes the cooling panel 130, which is disposed on the irradiated surface or on the rear surface of the sensor substrate 38. Further, the cooling panel 130 cools only (the pixels 50 depending on) the recording areas of the sensor substrate 38 where radiation image information has been recorded. Therefore, compared to conventional image capturing systems, the image capturing system 20A can avoid unnecessary cooling of the sensor substrate 38, and energy consumed by the radiation solid-state detecting device 26 including the cooling panel 130 and the overall image capturing system 20A can be reduced.

Before radiation image information is recorded in the sensor substrate 38, the area specifying unit 134 specifies certain pixels 50 within the sensor substrate 38 as pixels 50 for recording radiation image information, based on the image capturing conditions from the controller 28. The area specifying unit 134 outputs the specified pixels 50 as recording areas to the temperature controller 133 and to the timing control circuit 48. Based on the recording areas, the timing control circuit 48 outputs timing control signals to the gate line driving circuit 44 and to the signal reading circuit 46, for thereby reliably reading image signals from the pixels 50 where radiation image information has been recorded.

The cooling panel 130 comprises the cooling units 142a through 142i, which are placed on the irradiated surface or on the rear surface of the sensor substrate 38. The temperature controller 133 of the cooling panel energizing unit 132 (the temperature regulation control means 135) energizes those among the cooling units 142a through 142i that face toward the specified recording areas. Since the temperature controller 133 selectively energizes the cooling units 142a through 142i based on the specified recording areas, the specified recording areas are reliably cooled, whereas other areas of the sensor substrate 38 are prevented from being cooled. As a result, the sensor substrate 38 is cooled effectively without wasteful energy consumption.

If only the cooling units 142b, 142e are selectively energized, as shown in FIG. 7A, or if only the cooling unit 142e is selectively energized, as shown in FIG. 7B, the areas of the sensor substrate 38 that face the de-energized cooling units radiate heat out of the cooling panel 130 by themselves, based on thermal conduction of the sensor substrate 38.

The cooling panel energizing unit 132 comprises the temperature controller 133, the temperature sensor 138, and the fan 140. The temperature sensor 138 detects the temperature of the sensor substrate 38 depending on the temperature of amorphous selenium within the specified recording areas. The temperature controller 133 determines whether the detected temperature exceeds the upper-limit temperature for the sensor substrate 38, depending on the upper-limit value of the temperature range for amorphous selenium. If the temperature controller 133 judges that the detected temperature has exceeded the upper-limit temperature, then the temperature controller 133 energizes the cooling panel 130 and the fan 140, so that (the temperature of the amorphous selenium indicated by) the temperature of the sensor substrate 38 will drop to (the upper-limit value of the temperature range indicated by) the upper-limit temperature. The fan 140 applies air to the cooling panel 130 for promoting radiation of heat, which is transferred from the sensor substrate 38 to the cooling panel 130, and out of the cooling panel 130. Therefore, the cooling panel 130 and the sensor substrate 38 are cooled efficiently.

Each of the cooling areas 142a through 142i comprises the Peltier devices 156, which are arrayed in a matrix on the endothermic substrate 146 that is held closely against the rear surface of the sensor substrate 38. The temperature controller 133 cools the specified recording areas by supplying direct current from the DC power supply 144 to the Peltier devices 156. Heat in the sensor substrate 38 is thus reliably radiated out of the cooling panel 130, based on the Peltier effect exhibited by the Peltier devices 156.

If the cooling panel 130 is disposed on the irradiated surface of the sensor substrate 38, then the cooling panel 130 should be made of a material permeable to radiation X. Therefore, it is still possible to cool the sensor substrate 38, regardless of the radiation X being applied to the sensor substrate 38.

FIG. 7 shows in perspective a mammographic apparatus 170 utilized for breast cancer screening, which incorporates the image capturing system 20A according to the first embodiment.

As shown in FIG. 7, the mammographic apparatus 170 includes an upstanding base 172, a vertical arm 176 fixed to a horizontal swing shaft 174 disposed substantially centrally on the base 172, a radiation source housing unit 180 housing therein a radiation source (not shown) for applying radiation X to a breast 179 (see FIG. 9) of a subject 22 to be imaged and which is fixed to an upper end of the arm 176, an image capturing base 182 mounted on a lower end of the arm 176 in confronting relation to the radiation source housing unit 180, and a compression plate 184 for compressing and holding the breast 179 against the image capturing base 182.

When the arm 176, to which the radiation source housing unit 180 and the image capturing base 182 are secured, is angularly moved about the swing shaft 174 in the directions indicated by the arrow A, an image capturing direction with respect to the breast 179 of the subject 22 can be adjusted. The compression plate 184 coupled to the arm 176 is disposed between the radiation source housing unit 180 and the image capturing base 182. The compression plate 184 is vertically displaceable along the arm 176 in the directions indicated by the arrow B.

A display control panel 186 is connected to the base 172, for displaying image capturing information including an image capturing region, an image capturing direction, etc., of the subject 22, which have been detected by the mammographic apparatus 170, as well as for displaying ID information of the subject 22, etc., and setting such items of information, if necessary. The display control panel 186 includes functions that are part of the functions of the console 30 and the display device 34 (see FIG. 1).

Figure 9:
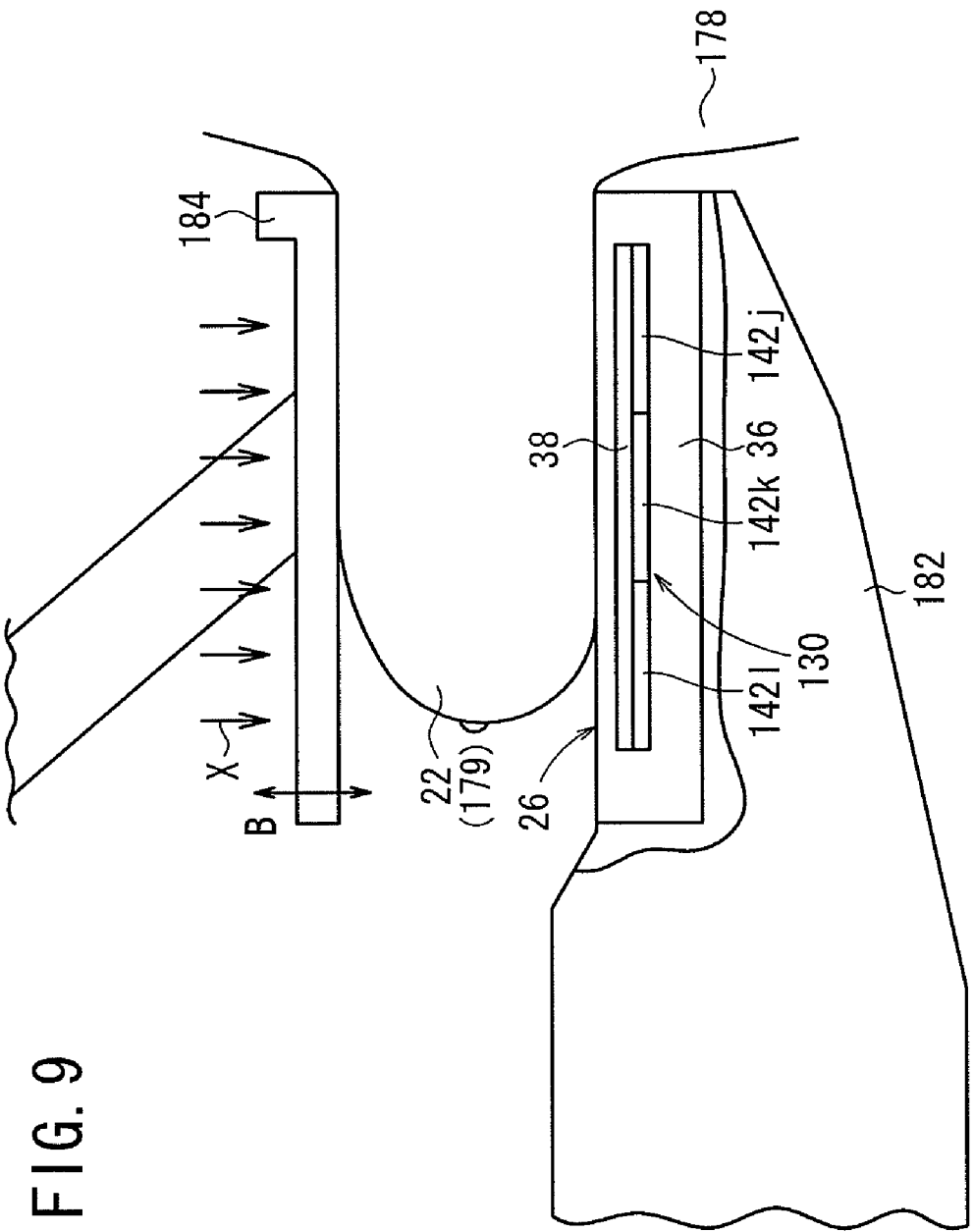
FIG. 9 is a fragmentary vertical elevational view, partly in cross section, showing internal structural details of an image capturing base of the mammographic apparatus shown in FIG. 8.

FIG. 9 shows the internal structural details of the image capturing base 182 of the mammographic apparatus 170. In FIG. 9, the breast 179 of the subject 22 to be imaged is shown as being placed between the image capturing base 182 and the compression plate 184.

The image capturing base 182 houses therein the radiation solid-state detecting device 26 for storing radiation image information, which is captured based on radiation X output from the radiation source in the radiation source housing unit 180, and outputting electric signals representative of the stored radiation image information. In FIG. 9, the cooling panel 130 is disposed on the rear surface of the sensor substrate 38.

Figure 10:
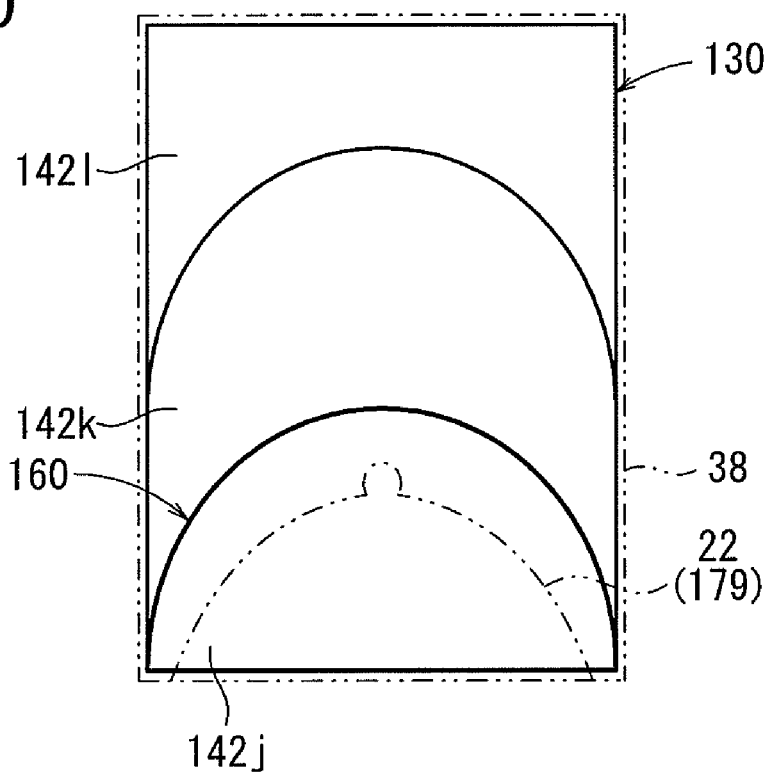
FIG. 10 is a plan view showing the manner in which a cooling unit is selected for capturing an image of the breast of the subject.

FIG. 10 shows in plan the manner in which the temperature controller 133 (see FIG. 1) selects one of the cooling units 142j through 142l, so as to be supplied with direct current from the DC power supply 144 based on the recording areas input from the area specifying unit 134. The area specifying unit 134 specifies pixels 50 (see FIG. 3) in which to record radiation image information representing the breast 179, based on the image capturing conditions transmitted from the controller 28, and outputs the specified pixels 50 as a radiation image information recording area to the temperature controller 133 and to the timing control circuit 48. Based on the input recording areas, the temperature controller 133 selects a cooling unit 142j which, as viewed in plan, faces the specified pixels 50 for recording radiation image information of the breast 179 therein. Further, the temperature controller 133 supplies the Peltier devices 156 (see FIGS. 5A through 6) of the selected cooling unit 142j with direct current from the DC power supply 144.

Figure 8:
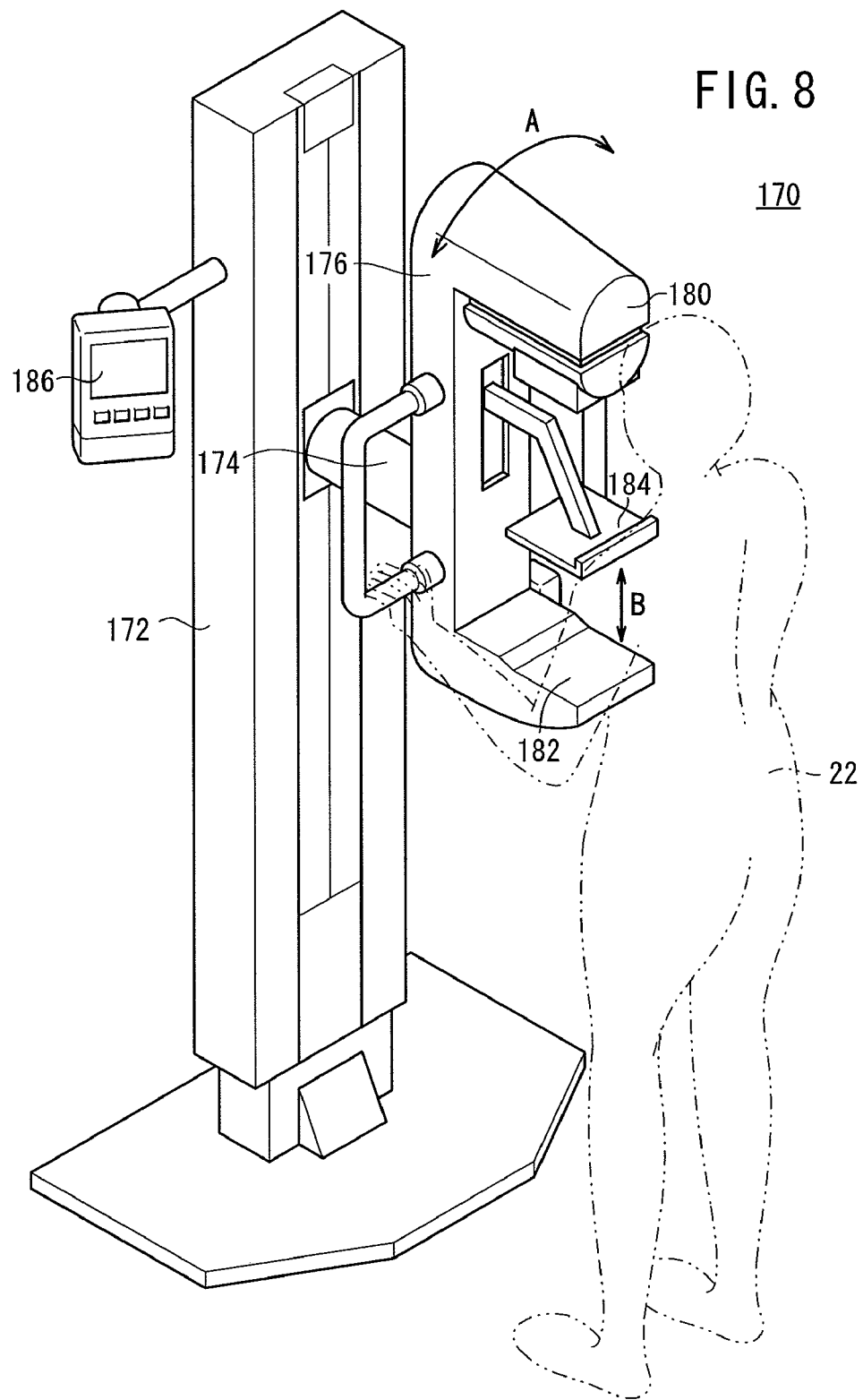
FIG. 8 is a perspective view of a mammographic apparatus, which incorporates the image capturing system shown in FIG. 1.

In the mammographic apparatus 170 shown in FIGS. 8 through 10, the cooling panel 130 is disposed on the rear surface of the sensor substrate 38. However, the cooling panel 130 may also be disposed on the irradiated surface of the sensor substrate 38. In FIG. 10, the temperature controller 133 selects the cooling unit 142j. However, the temperature controller 133 may select cooling units 142j, 142k, or other cooling units 142j through 142l, depending on the image capturing conditions for the subject 22.

The radiation solid-state detecting device 26, which includes the cooling panel 130 disposed on the surface of the sensor substrate 38, is housed in the image capturing base 182. The mammographic apparatus 170 offers the same advantages as those described above according to the first embodiment. That is, when the breast 179 touches the radiation solid-state detecting device 26, the body temperature of the subject 22 is transmitted to the sensor substrate 38 through the breast 179 so that the temperature of the sensor substrate 38 rises. Therefore, the region of the sensor substrate 38 corresponding to the region where the breast 179 touches is cooled.

Figure 11:
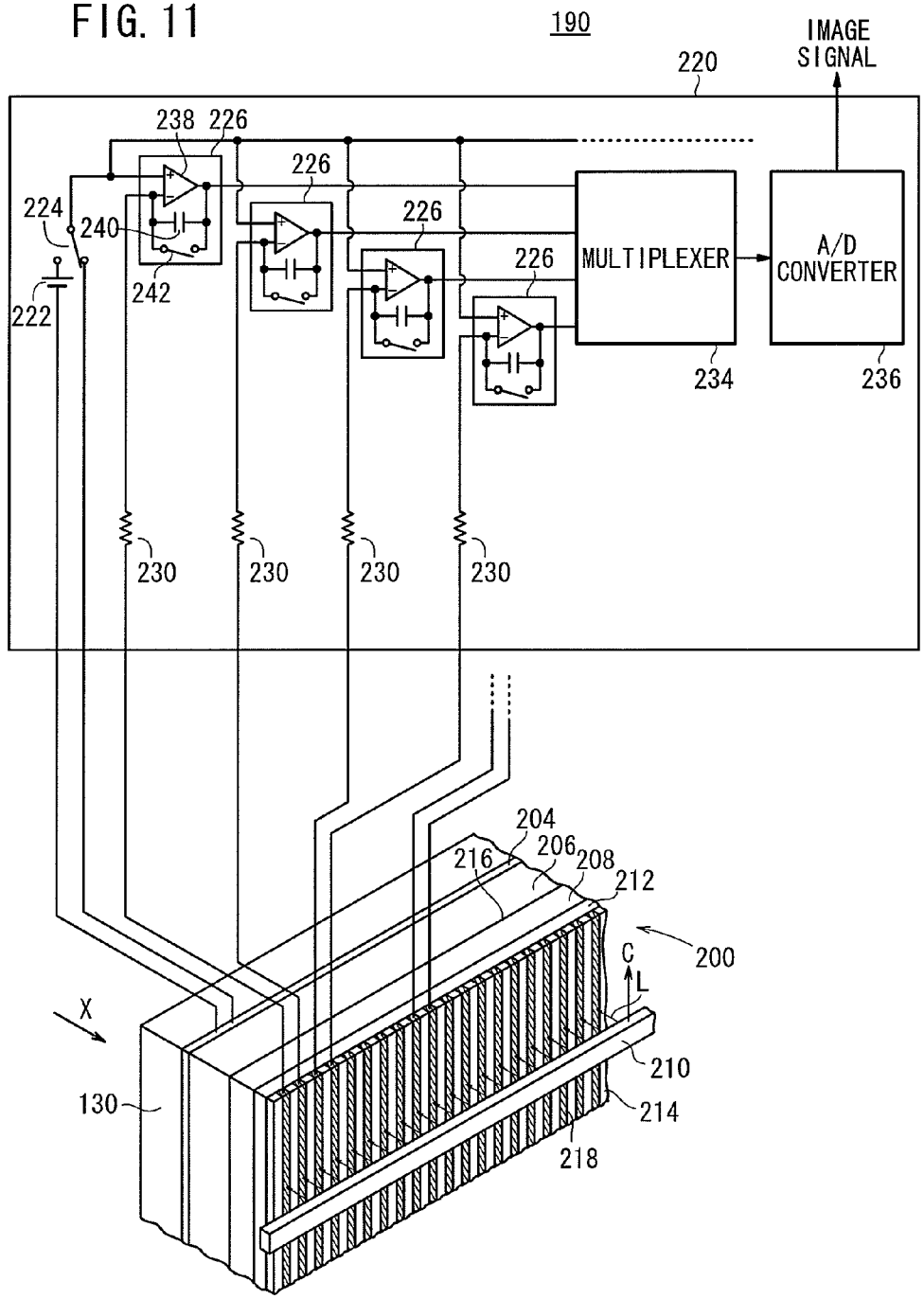
FIG. 11 is a view showing a radiation solid-state detecting device according to another embodiment of the present invention.

FIG. 11 shows a light readout type radiation solid-state detecting device 190 according to another embodiment of the present invention. Unlike the direct conversion type radiation solid-state detecting device 26 that employs the TFTs 52 shown in FIG. 3, the light readout type radiation solid-state detecting device 190 has a sensor substrate 200 for storing therein radiation image information as an electrostatic latent image, and for reading the electrostatic latent image as electric charge information when the sensor substrate 200 is irradiated with reading light L from a reading light source 210.

The sensor substrate 200 comprises a first electrode layer 204 permeable to radiation X, a recording photoconductive layer 206 that becomes electrically conductive when irradiated with radiation X, a charge transport layer 208, which acts substantially as an electric insulator with respect to latent image electric charges, and as an electric conductor with respect to transport electric charges, which have a polarity opposite to the latent image electric charges, a reading photoconductive layer 212 that becomes electrically conductive when irradiated with reading light L from the reading light source 210, and a second electrode layer 214 permeable to the reading light L. The above-mentioned layers are successively arranged in this order from the surface of the sensor substrate 200, which is irradiated with the radiation X.

A charge storage region 216 for storing electric charges generated by the recording photoconductive layer 206 is disposed between the recording photoconductive layer 206 and the charge transport layer 208. The second electrode layer 214 comprises a number of linear electrodes 218 extending in the direction indicated by the arrow C, which is perpendicular to the direction that the reading light source 210 extends. The first electrode layer 204 and the linear electrodes 218 of the second electrode layer 214 are connected to a signal reading circuit 220, for thereby reading electric charge information of latent image electric charges stored in the charge storage region 216.

The signal reading circuit 220 comprises a power supply 222 and a switch 224 for applying a given voltage between the first electrode layer 204 and the second electrode layer 214 of the sensor substrate 200, a plurality of current detecting amplifiers 226 connected to the linear electrodes 218 of the second electrode layer 214 for detecting currents representing the radiation image information as latent image electric charges, a plurality of resistors 230 connected to the current detecting amplifiers 226, a multiplexer 234 for successively switching between output signals from the current detecting amplifiers 226, and an A/D converter 236 for converting analog image signals from the multiplexer 234 into digital image signals. Each of the current detecting amplifiers 226 comprises an operational amplifier 238, an integrating capacitor 240, and a switch 242.

As shown in FIG. 11, the cooling panel 130 is disposed on the irradiated surface of the sensor substrate 200. However, the cooling panel 130 may also be disposed on the rear surface of the sensor substrate 200.

The radiation solid-state detecting device 190 shown in FIG. 11 operates as follows: The switch 224 is operated to connect the movable contact thereof to the power supply 222 in order to apply voltage between the first electrode layer 204 and the second electrode layer 214, whereupon radiation X is applied to the subject 22 (see FIG. 1). Radiation X that has passed through the subject 22 is applied through the first electrode layer 204 to the recording photoconductive layer 206. The recording photoconductive layer 206 becomes electrically conductive and generates electric charge pairs. Among the generated electric charge pairs, positive electric charges combine with negative electric charges supplied from the power supply 222 to the first electrode layer 204, and the positive electric charges disappear. Negative electric charges generated by the recording photoconductive layer 206 move toward the charge transport layer 208. Since the charge transport layer 208 acts substantially as an electric insulator with respect to the negative electric charges, the negative electric charges become stored as an electrostatic latent image in the charge storage region 216 that exists as an interface between the recording photoconductive layer 206 and the charge transport layer 208.

After the electrostatic latent image has been stored in the sensor substrate 200, the signal reading circuit 220 reads the radiation image information. The switch 224 is operated to connect the movable contact thereof between the non-inverting input terminals of the operational amplifiers 238 of the current detecting amplifiers 226 and the first electrode layer 204 of the sensor substrate 200.

While the reading light source 210 moves in the auxiliary scanning direction, as indicated by the arrow C, the light source 210 applies reading light L to the reading photoconductive layer 212. The switches 242 of the current detecting amplifiers 226 are turned on and off at intervals corresponding to the pixel pitch in the auxiliary scanning direction, for thereby reading the radiation image information as electric charge information that represents the electrostatic latent image.

When the reading light L is applied through the second electrode layer 214 to the reading photoconductive layer 212, the reading photoconductive layer 212 becomes electrically conductive and generates electric charge pairs. Among the generated electric charge pairs, positive electric charges reach the charge storage region 216 through the charge transport layer 208, which acts substantially as an electric insulator with respect to the positive electric charges. In the charge storage region 216, positive electric charges combine with negative electric charges, which represent the electrostatic latent image stored in the charge storage region 216, and the positive electric charges disappear. The negative electric charges generated by the reading photoconductive layer 212 recombine with the positive electric charges of the linear electrodes 218 of the second electrode layer 214, and the negative electric charges disappear. When the electric charges disappear, currents are generated by the linear electrodes 218 and are read by the signal reading circuit 220 as electric charge information representing the radiation image information.

Currents generated by the linear electrodes 218 are integrated by the current detecting amplifiers 226 and supplied as voltage signals to the multiplexer 234. The multiplexer 234 successively switches between the current detecting amplifiers 226 in the main scanning direction along which the linear electrodes 218 are arrayed, and supplies voltage signals to the A/D converter 236. The A/D converter 236 converts the supplied analog voltage signals into digital image signals, and supplies digital image signals representing the radiation image information to the image processor 32. Each time radiation image information is read from an array of pixels across the auxiliary scanning direction, the switches 242 of the current detecting amplifiers 226 are turned on in order to discharge electric charges stored in the integrating capacitors 240. The above operation is repeated while the reading light source 210 is moved in the auxiliary scanning direction indicated by the arrow C, in order to read two-dimensional radiation image information stored in the sensor substrate 200.

In the image capturing system 20A, which incorporates the radiation solid-state detecting device 190, the cooling panel 130 is disposed on the surface of the sensor substrate 38. Therefore, the image capturing system 20A that incorporates the radiation solid-state detecting device 190 offers the same advantages as described above according to the first embodiment.

Rather than using the direct conversion type radiation solid-state detecting device 26 or the light readout type radiation solid-state detecting device 190 for converting applied radiation X directly into electric charge information, an indirect conversion type radiation detector including a scintillator may be employed for converting applied radiation X into visible light, along with a detecting device for converting the visible light into electric charge information.

Instead of the TFTs 52, such a device as a CCD (Charge Coupled Device), a CMOS (Complementary Metal Oxide Semiconductor) device or the like may be used for a direct- or indirect conversion type radiation detecting device.

When radiation image information is recorded in each of the pixels 50, or when recorded radiation image information is read from the pixels 50, energization of the fan 140 or the direct current supplied to the Peltier devices 156 may be added to the radiation image information as noise, which tends to lower the quality of the radiation image information. This problem may be solved as follows: When radiation image information is recorded in and/or read from the pixels 50, the temperature regulation control means 135 is inactivated in order to halt the cooling of the sensor substrate 38. When radiation image information is not recorded and/or is not being read from the pixels 50, the temperature regulation control means 135 is activated to cool the sensor substrate 38.

An image capturing system 20B according to a second embodiment of the present invention will be described below with reference to FIG. 1 and FIGS. 12A through 12C. Those parts of the image capturing system 20B that are identical to those used in the image capturing system 20A (see FIGS. 1 through 11) according to the first embodiment shall be denoted by identical reference characters, and will not be described in detail below.

The image capturing system 20B according to the second embodiment differs from the image capturing system 20A according to the first embodiment, in that the cooling panel 130 comprises a cooling unit 160, which is smaller in area than the sensor substrate 38.

Figure 12A:
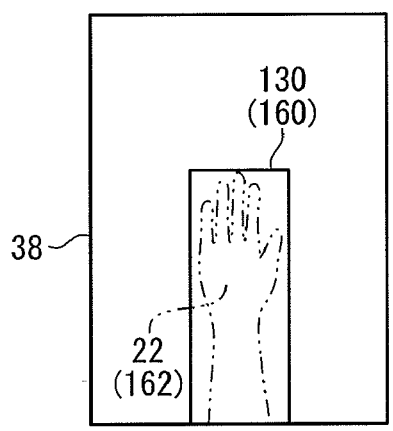
FIG. 12A is a plan view showing the layout of a cooling unit for capturing an image of an arm of the subject.
Figure 12B:
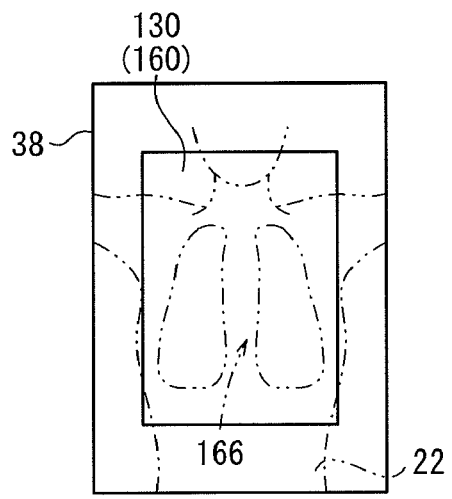
FIG. 12B is a plan view showing the layout of a cooling unit for capturing an image of the chest of the subject.
Figure 12C:
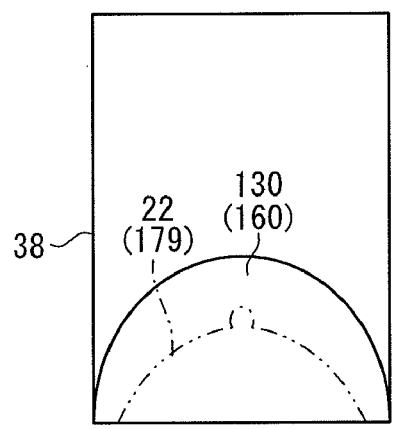
FIG. 12C is a plan view showing the layout of a cooling unit for capturing an image of the breast of the subject.
Figure 13:
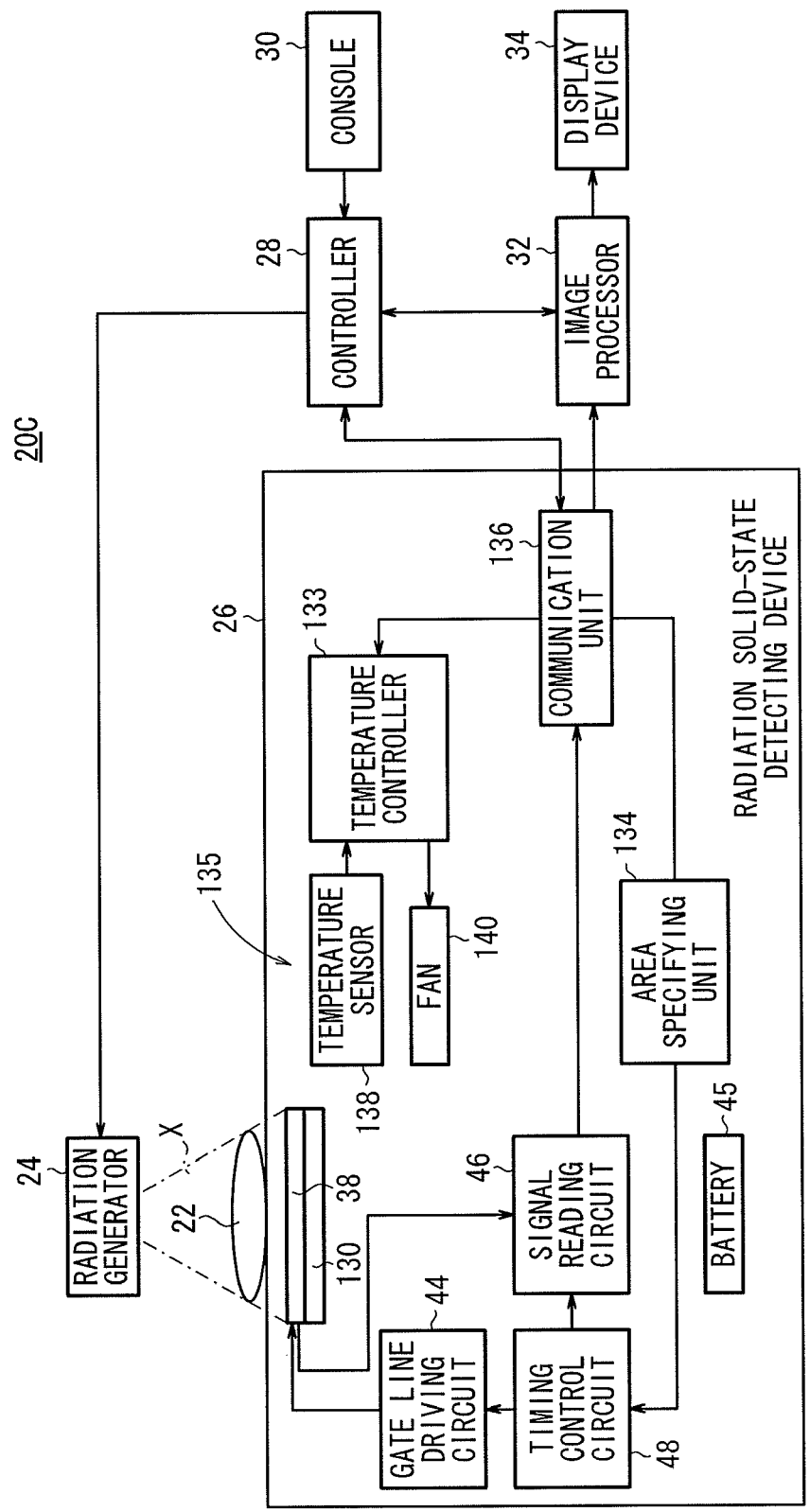
FIG. 13 is a block diagram of an image capturing system according to a third embodiment of the present invention.

As shown in FIGS. 12A through 12C, the cooling unit 160 has an area that is large enough to cover the region of the subject 22 to be imaged and corresponding recording areas within the sensor substrate 38.

FIG. 12A shows in plan view the layout of the cooling unit 160 for capturing an image of an arm 162 of the subject 22. The layout of the cooling unit 160 shown in FIG. 12A corresponds to the layout of the selected cooling units 142b, 142e shown in FIG. 7A.

FIG. 12B shows in plan view the layout of the cooling unit 160 for capturing an image of the chest 166 of the subject 22. The layout of the cooling unit 160 shown in FIG. 12B corresponds to the layout of the selected cooling unit 142e shown in FIG. 7B. Since (the recording area for) the chest 166 is positioned substantially centrally on the sensor substrate 38, the cooling unit 160 also is disposed substantially centrally on the sensor substrate 38, depending on the recording area.

FIG. 12C shows in plan view the layout of the cooling unit 160 for capturing an image of the breast 179 of the subject 22. The layout of the cooling unit 160 shown in FIG. 12C corresponds to the layout of the selected cooling unit 142j shown in FIG. 10.

For cooling the recording areas, the temperature controller 133 (see FIG. 1) supplies direct current from the DC power supply 144 to the Peltier devices 156 of the cooling unit 160.

In the image capturing system 20B according to the second embodiment, the cooling panel 130 comprises the cooling unit 160, which has an area corresponding to the recording areas, and which is disposed on the surface of the sensor substrate 38. Consequently, the cooling panel 130 can reliably and efficiently cool the recording areas.

If a substantially central region, as viewed in plan, of the irradiated surface or the rear surface of the sensor substrate 38 is specified as a recording area for capturing a radiation image of the chest 166 as shown in FIG. 12B, then the cooling unit 160 also is disposed centrally on the sensor substrate 38 in alignment with the recording area. Accordingly, the cooling panel 130 can reliably cool the recording area.

In FIGS. 12A through 12C, those areas of the sensor substrate 38 which do not face the cooling unit 160 radiate heat out of the cooling panel 130 by themselves, based on thermal conduction of the sensor substrate 38.

An image capturing system 20C according to a third embodiment of the present invention will be described below with reference to FIGS. 13 through 16D.

The image capturing system 20C according to the third embodiment differs from the image capturing systems 20A, 20B (FIGS. 1 through 12C) according to the first and second embodiments, in that the cooling panel 130 comprises a carbon sheet 250 together with block-shaped heat radiating members 252, rather than the Peltier devices 156.

Figure 14A:
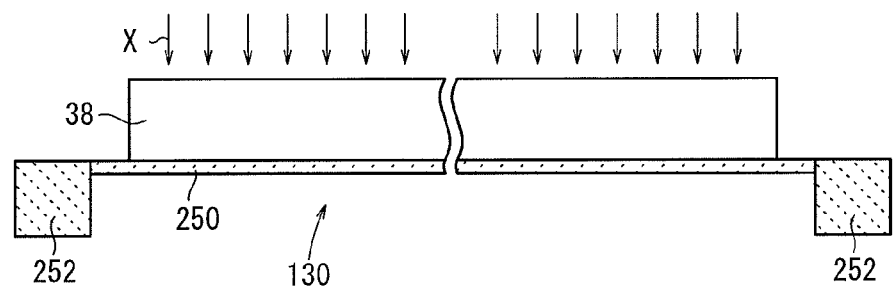
FIGS. 14A and 14B are fragmentary cross-sectional views of a sensor substrate and a cooling panel shown in FIG. 13.
Figure 14B:
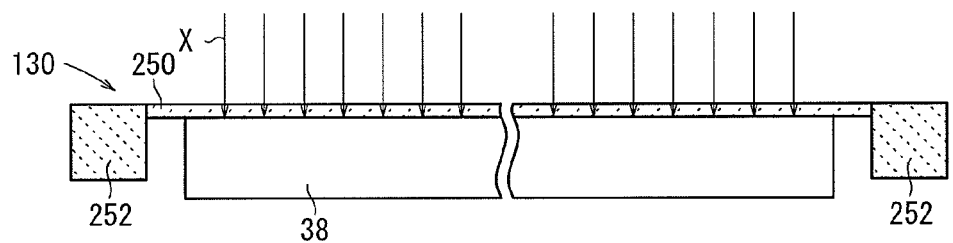

As shown in FIGS. 14A and 14B, the carbon sheet 250, which is thermally conductive, is disposed on the irradiated surface or on the rear surface of the sensor substrate 38, and the heat radiating members 252 are coupled to respective side edges (ends) of the carbon sheet 250. In FIG. 14A, the carbon sheet 250 is disposed on the rear surface of the sensor substrate 38.

The carbon sheet 250 is disposed on the sensor substrate 38, such that opposite side edge portions thereof project from corresponding side edges of the sensor substrate 38. The heat radiating members 252 are spaced from respective side edges of the sensor substrate 38, and are coupled to respective ends of the carbon sheet 250, which project from the side edges of the sensor substrate 38. Therefore, heat from the sensor substrate 38 is transferred through the carbon sheet 250 to the heat radiating members 252, whereupon heat is radiated out of the cooling panel 130. The carbon sheet 250 is made of a material whose thermal conductivity is oriented in a planar direction along surfaces of the sensor substrate 38 and the carbon sheet 250, or specifically toward the heat radiating members 252, for thereby efficiently transferring heat from the sensor substrate 38 to the heat radiating members 252.

If the cooling panel 130 is disposed on the irradiated surface of the sensor substrate 38, then the carbon sheet 250 of the cooling panel 130 should be made of a material that is permeable to radiation X.

With the image capturing system 20C according to the third embodiment, heat from the sensor substrate 38 is radiated out of the cooling panel 130 through the carbon sheet 250, and through the heat radiating members 252 thereof. Therefore, the temperature controller 133, the temperature sensor 138, and the fan 140 of the temperature regulation control means 135 do not function as a cooling panel energizing unit for energizing the cooling panel 130.

Specifically, the area specifying unit 134 outputs the recording areas based on the image capturing conditions from the controller 28 only to the timing control circuit 48. If the temperature controller 133 judges that the temperature of the sensor substrate 38 detected by the temperature sensor 138 has exceeded the upper-limit temperature for the sensor substrate 38, the temperature controller 133 simply energizes the fan 140. The fan 140 applies air to the heat radiating members 252 in order to cool the heat radiating members 252 and to promote radiation of heat therefrom.

FIGS. 15A through 15D shown in plan the cooling panel 130 including the carbon sheet 250, which is disposed substantially entirely on the irradiated surface or on the rear surface of the sensor substrate 38.

Figure 15A:
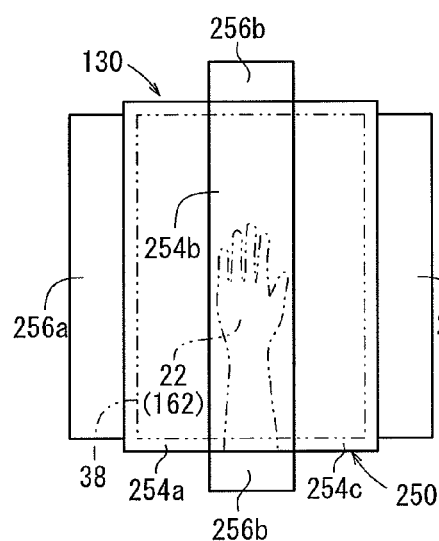
FIG. 15A is a plan view showing the layout of a cooling panel for capturing an image of an arm of the subject.

In FIG. 15A, the carbon sheet 250 comprises three carbon sheet segments 254a through 254c disposed on the sensor substrate 38. The heat radiating members 252 comprise heat radiating blocks 256a through 256c disposed on respective ends of the carbon sheet segments 254a through 254c, which are spaced from the sensor substrate 38. Heat from the areas of the sensor substrate 38 that face the carbon sheet segments 254a through 254c is transferred through the carbon sheet segments 254a through 254c, and radiated from the heat radiating blocks 256a through 256c and out of the cooling panel 130. FIG. 15A shows the layout of the cooling panel 130 for capturing an image of an arm 162 of the subject 22. The carbon sheet segment 254b, which faces the arm 162 to be imaged and corresponding recording areas of the sensor substrate 38, transfers heat from the recording areas to the heat radiating block 256b, whereupon heat is radiated out of the cooling panel 130.

Figure 15B:
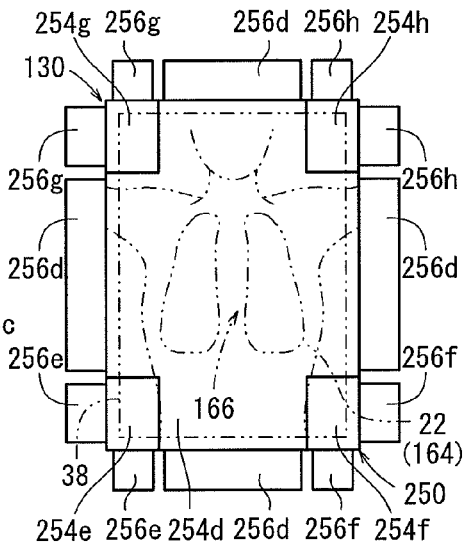
FIG. 15B is a plan view showing the layout of a cooling panel for capturing an image of the chest of the subject.

In FIG. 15B, the carbon sheet 250 comprises a substantially criss-crossed carbon sheet segment 254d, which is disposed on the sensor substrate 38, and four carbon sheet segments 254e through 254h disposed on the sensor substrate 38 around the carbon sheet segment 254d. Further, the heat radiating members 252 comprise heat radiating blocks 256d through 256h disposed on respective ends of the carbon sheet segments 254d through 254h, which are spaced from the sensor substrate 38. Heat from areas of the sensor substrate 38 that face the carbon sheet segments 254d through 254h is transferred through the carbon sheet segments 254d through 254h, and radiated from the heat radiating blocks 256d through 256h and out of the cooling panel 130. FIG. 15B shows the layout of the cooling panel 130 for capturing an image of the chest 166 of the subject 22. The carbon sheet segment 254d, which faces the chest 166 to be imaged and corresponding recording areas of the sensor substrate 38, transfers heat from the recording areas to the heat radiating blocks 256d, whereupon heat is radiated out of the cooling panel 130.

Figure 15C:
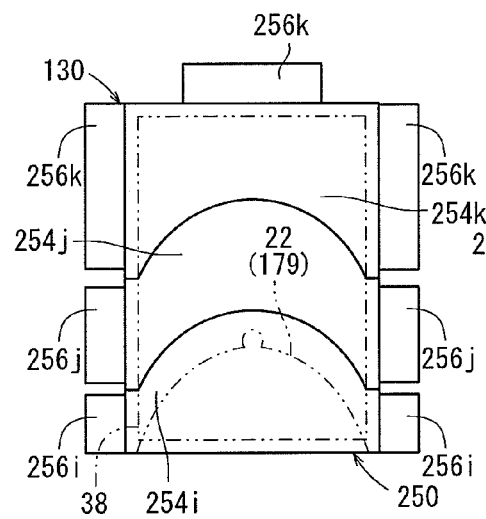
FIGS. 15C and 15D are plan views showing the layouts of cooling panels for capturing an image of the breast of the subject.

In FIG. 15C, the carbon sheet 250 comprises three carbon sheet segments 254i through 254k disposed on the sensor substrate 38. The heat radiating members 252 comprise heat radiating blocks 256i through 256k disposed on respective ends of the carbon sheet segments 254i through 254k, which are spaced from the sensor substrate 38. Heat from the areas of the sensor substrate 38, which face toward the carbon sheet segments 254i through 254k, is transferred through the carbon sheet segments 254i through 254k and radiated from the heat radiating blocks 256i through 256k out of the cooling panel 130. FIG. 15C shows the layout of the cooling panel 130 for capturing an image of a breast 179 of the subject 22. The carbon sheet segment 254i, which faces the breast 179 to be imaged and corresponding recording areas of the sensor substrate 38, transfers heat from the recording areas to the heat radiating blocks 256i. The heat radiating blocks 256i radiate heat out of the cooling panel 130.

Figure 15D:
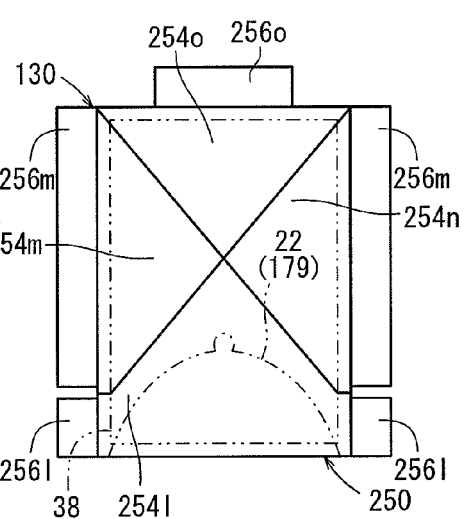

In FIG. 15D, the carbon sheet 250 comprises four carbon sheet segments 254l through 254o disposed on the sensor substrate 38. The heat radiating members 252 comprise heat radiating blocks 256l through 256o disposed on respective ends of the carbon sheet segments 254l through 254o, which are spaced from the sensor substrate 38. Heat from the areas of the sensor substrate 38, which face toward the carbon sheet segments 254l through 254o, is transferred through the carbon sheet segments 254l through 254o and radiated from the heat radiating blocks 256l through 256o out of the cooling panel 130. FIG. 15D shows the layout of the cooling panel 130 for capturing an image of a breast 179 of the subject 22. The carbon sheet segment 254l, which faces the breast 179 to be imaged and corresponding recording areas of the sensor substrate 38, transfers heat from the recording areas to the heat radiating blocks 256l. The heat radiating blocks 256l radiate heat out of the cooling panel 130.

FIGS. 16A through 16D show in plan the cooling panel 130 including the carbon sheet 250, which is of a smaller area than the sensor substrate 38, disposed on the irradiated surface or on the rear surface of the sensor substrate 38.

As shown in FIGS. 16A through 16D, the carbon sheet 250 has an area that is large enough to cover the region of the subject 22 to be imaged and corresponding recording areas within the sensor substrate 38.

Figure 16A:
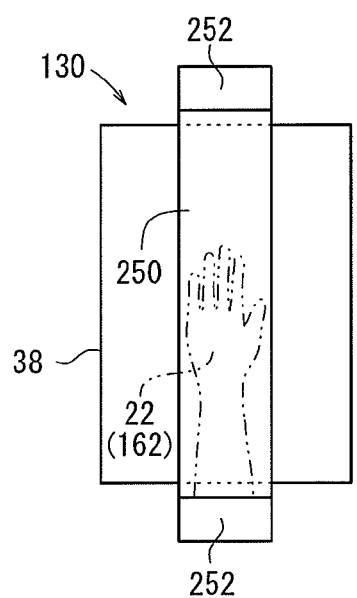
FIG. 16A is a plan view showing the layout of a cooling panel for capturing an image of an arm of the subject.

FIG. 16A shows in plan the layout of the carbon sheet 250 for capturing an image of an arm 162 of the subject 22. The layout of the carbon sheet 250 shown in FIG. 16A corresponds to the layout of the selected cooling units 142b, 142e shown in FIG. 7A, and to the carbon sheet segment 254b shown in FIG. 15A.

Figure 16B:
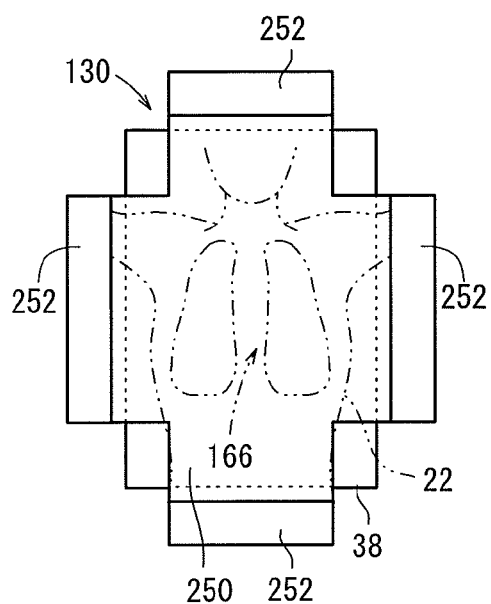
FIG. 16B is a plan view showing the layout of a cooling panel for capturing an image of the chest of the subject.

FIG. 16B shows in plan the layout of the carbon sheet 250 for capturing the image of the chest 166 of the subject 22. The layout of the carbon sheet 250 shown in FIG. 16B corresponds to the layout of the selected cooling unit 142e shown in FIG. 7B, and to the carbon sheet segment 254d shown in FIG. 15B. Since (the recording area for) the chest 166 is positioned substantially centrally on the sensor substrate 38, the carbon sheet 250 also is disposed substantially centrally on the sensor substrate 38, depending on the recording areas.

Figure 16C:
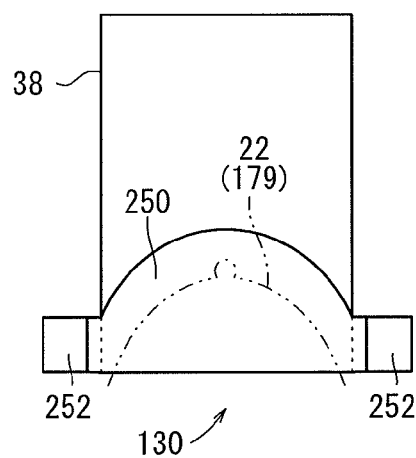
FIGS. 16C and 16D are plan views showing the layouts of cooling panels for capturing an image of the breast of the subject.

FIG. 16C shows in plan the layout of the carbon sheet 250 for capturing an image of a breast 179 of the subject 22. The layout of the carbon sheet 250 shown in FIG. 16C corresponds to the layout of the selected cooling unit 142j shown in FIG. 10, and to the carbon sheet segment 254i shown in FIG. 15C.

Figure 16D:
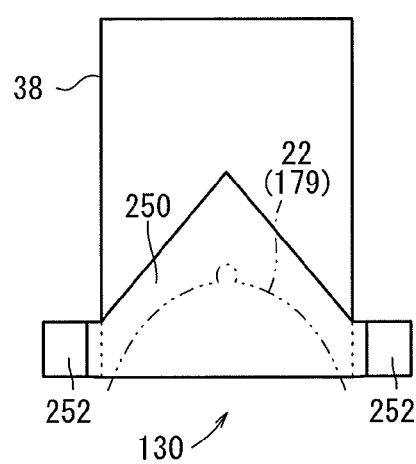

FIG. 16D also shows in plan the layout of the carbon sheet 250 for capturing an image of a breast 179 of the subject 22. The layout of the carbon sheet 250 shown in FIG. 16D corresponds to the carbon sheet segment 254l shown in FIG. 15D.

In the image capturing system 20C according to the third embodiment, the cooling panel 130 comprises the thermally conductive carbon sheet 250, disposed on the irradiated surface or on the rear surface of the sensor substrate 38, and the heat radiating members 252 coupled to ends of the carbon sheet 250 for discharging heat that is transferred from the recording areas through the carbon sheet 250. Although the cooling panel 130 does not contain Peltier devices 156, the cooling panel 130 can still reliably radiate the heat of the recording areas from the heat radiating members 252. The cooling panel 130 is of a simple structure, including the carbon sheet 250 and the heat radiating members 252, and the cooling panel 130 is capable of radiating heat from the recording areas without supplying energy from the cooling panel energizing unit 132. Consequently, the cooling panel 130 makes it possible for the radiation solid-state detecting device 26 to reliably save energy.

The temperature sensor 138 detects the temperature of the sensor substrate 38 depending on the temperature of the amorphous selenium within the recording areas. The temperature controller 133 determines whether the detected temperature exceeds the upper-limit temperature for the sensor substrate 38, depending on the upper-limit value of the temperature range for amorphous selenium. If the temperature controller 133 judges that the detected temperature has exceeded the upper-limit temperature, then the temperature controller 133 energizes the fan 140 so that (the temperature of the amorphous selenium as indicated by) the temperature of the sensor substrate 38 will drop to (the upper-limit value of the temperature range indicated by) the upper-limit temperature. The fan 140 applies air to the heat radiating members 252 for promoting radiation and transfer of heat from the sensor substrate 38, through the carbon sheet 250 to the heat radiating members 252, and out of the cooling panel 130. Therefore, the sensor substrate 38 is cooled efficiently.

Furthermore, the cooling panel 130 comprises the carbon sheet segments 254a through 254o that make up the carbon sheet 250, disposed on the irradiated surface or on the rear surface of the sensor substrate 38, together with the heat radiating blocks 256a through 256o of the heat radiating members 252, which are coupled respectively to ends of the carbon sheet segments 254a through 254o that are spaced from the sensor substrate 38. The carbon sheet segments 254a through 254o, which face the recording areas, and the heat radiating blocks 256a through 256o, which are coupled to the carbon sheet segments 254a through 254o, serve to cool the recording areas for thereby reliably cooling the sensor substrate 38.

The cooling panel 130 is constructed from the carbon sheet 250, which has a certain area corresponding to the recording areas and is disposed on the surface of the sensor substrate 38, and the heat radiating members 252, which are coupled to ends of the carbon sheet 250. Constructed in this manner, the cooling panel 130 is capable of reliably and efficiently cooling the recording areas.

If a substantially central region, as viewed in plan, of the irradiated surface or the rear surface of the sensor substrate 38 is specified as a recording area for capturing a radiation image of the chest 166, as shown in FIG. 16B, then the carbon sheet 250 also is disposed centrally on the sensor substrate 38 in alignment with the recording area. Accordingly, the cooling panel 130 can reliably cool the recording area.

In FIGS. 16A through 16D, those areas of the sensor substrate 38 that do not face the carbon sheet 250 radiate heat out of the cooling panel 130 by themselves, based on thermal conduction of the sensor substrate 38.

Rather than cooling the heat radiating members 252 (the heat radiating blocks 256a through 256o) with the fan 140 serving as a cooling unit, the heat radiating members 252 may be cooled by heat pipes, a thermally conductive gel, or by cooling water.

Although certain preferred embodiments of the present invention have been shown and described in detail, it should be understood that various changes and modifications may be made to the embodiments without departing from the scope of the invention as set forth in the appended claims.

What is claimed is:

1. An image detecting device comprising:
    an image detector for recording an image and outputting the recorded image as image information; and
    a cooling panel disposed on a surface of the image detector for cooling a recording area in which the image is recorded in the image detector; and
    an area specifying unit for specifying a given area of the image detector as the recording area; and
    a cooling panel energizing unit for energizing the cooling panel to cool the recording area.

2. An image detecting device according to claim 1, wherein the cooling panel comprises
    a plurality of cooling units disposed on the surface of the image detector,
    wherein the cooling panel energizing unit energizes those of the cooling units that correspond to the recording area of the image detector.

3. An image detecting device according to claim 1, wherein the cooling panel energizing unit comprises:
    a temperature sensor for detecting a temperature of the image detector; and
    a temperature controller for energizing the cooling panel to lower the temperature to a predetermined temperature.

4. An image detecting device according to claim 1, wherein the cooling panel comprises
    a matrix of Peltier devices disposed on the surface of the image detector,
    wherein the cooling panel energizing unit supplies current to the Peltier devices to cool the recording area.

5. An image detecting device according to claim 1, wherein the cooling panel comprises a cooling unit having an area corresponding to the recording area and which is disposed on the surface of the image detector.

6. An image detecting device according to claim 5, wherein a substantially central portion, as viewed in plan, of the surface of the image detector is specified as the recording area, the cooling unit being disposed on the substantially central portion.

7. An image detecting device according to claim 1, wherein the image detecting device comprises a radiation image information detecting device;
    the image detector records radiation having passed through a subject and applied to a surface of the image detector as a radiation image, and outputs the recorded radiation image as radiation image information;
    the cooling panel is disposed on the surface of the image detector that is irradiated with radiation, or on a rear surface of the image detector, which is opposite to the surface; and
    if the cooling panel is disposed on the surface of the image detector that is irradiated with radiation, the cooling panel is permeable to the radiation.

8. An image detecting device according to claim 7, wherein the radiation image information detecting device comprises a radiation solid-state detecting device for storing radiation having passed through the subject as electric charge information, and reading the stored electric charge information as the radiation image information.

9. An image detecting device according to claim 8, wherein the radiation solid-state detecting device comprises a light readout type detector for reading the stored electric charge information as the radiation image information in response to reading light applied thereto.

10. An image capturing system comprising:
    an image detecting device according to claim 1; and
    a controller for controlling the image detecting device.

11. An image capturing system according to claim 10, further comprising:
    a radiation generator for generating radiation and applying the radiation to a subject,
    wherein the image detecting device records radiation having passed through the subject as a radiation image, and outputs the recorded radiation image as radiation image information, and
    wherein the controller controls the radiation generator and the image detecting device.

12. The image detecting device of claim 1, further comprising a controller responsive to an image recording condition to provide an area of recording signal, and wherein the area specifying unit specifies the given area based on the area of recording signal.

13. The image detecting device of claim 12, wherein the given area is less than an entirety of a recording surface of the image detector.

* * * * *